US012764962B2

(12) United States Patent
Kim et al.

(10) Patent No.: US 12,764,962 B2
(45) Date of Patent: Oct. 13, 2026

(54) THREE-DIMENSIONAL MEMORY DEVICE AND ENHANCED ELECTRONIC SYSTEM

(71) Applicant: Samsung Electronics Co., Ltd., Suwon-si (KR)

(72) Inventors: Kangmin Kim, Suwon-si (KR); Seungje Oh, Suwon-si (KR); Joohang Lee, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 451 days.

(21) Appl. No.: 18/212,323

(22) Filed: Jun. 21, 2023

(65) Prior Publication Data

US 2024/0023336 A1 Jan. 18, 2024

(30) Foreign Application Priority Data

Jul. 15, 2022 (KR) ........................ 10-2022-0087525

(51) Int. Cl.
*H10B 43/35* (2023.01)
*H10B 41/27* (2023.01)
(Continued)

(52) U.S. Cl.
CPC ............. *H10B 43/35* (2023.02); *H10B 41/27* (2023.02); *H10B 41/35* (2023.02); *H10B 43/27* (2023.02);
(Continued)

(58) Field of Classification Search
CPC ........ H10B 43/35; H10B 41/35; H10B 80/00; H10B 41/27; H10B 43/27; H01L 24/08;
(Continued)

(56) References Cited

U.S. PATENT DOCUMENTS 10,438,904 B2 10/2019 Ito et al.
10,833,096 B2 11/2020 Tanaka et al.
(Continued)

FOREIGN PATENT DOCUMENTS

JP 2009-224465 A 10/2009
JP 2019-165150 A 9/2019
(Continued)

OTHER PUBLICATIONS

Communication issued Jan. 26, 2024 by the European Patent Office in European Patent Application No. 23184329.3.
(Continued)

*Primary Examiner* — Eliseo Ramos Feliciano
*Assistant Examiner* — Timothy Edward Duren
(74) *Attorney, Agent, or Firm* — Sughrue Mion, PLLC

(57) ABSTRACT

The present disclosure provides for apparatuses and systems including integrated circuit devices. In some embodiments, an integrated circuit device includes a semiconductor substrate including a memory cell area and a connection area, a gate stack including a plurality of word line gate layers and a plurality of insulating layers and having a step structure in the connection area, a word line cut region passing through the plurality of word line gate layers in the memory cell area and the connection area and extending in a third direction, a plurality of first channel structures disposed on the memory cell area, a string select line gate layer disposed on the gate stack in the memory cell area, a plurality of second channel structures passing through the string select line gate layer, and a string select line cut region passing through the string select line gate layer.

16 Claims, 24 Drawing Sheets

(51) Int. Cl.

| | |
|---|---|
| ***H10B 41/35*** | (2023.01) |
| ***H10B 43/27*** | (2023.01) |
| ***H10B 80/00*** | (2026.01) |
| ***H10W 90/00*** | (2026.01) |

(52) U.S. Cl.
CPC ............ *H10B 80/00* (2023.02); *H10W 90/00* (2026.01); *H10W 90/792* (2026.01)

(58) Field of Classification Search
CPC ................. H01L 25/0657; H01L 25/18; H01L 2224/08145; H01L 2924/1431; H01L 2924/14511
See application file for complete search history.

(56) References Cited

U.S. PATENT DOCUMENTS

| | | | | |
|---|---|---|---|---|
| 10,868,037 | B2 | 12/2020 | Arai et al. | |
| 11,342,264 | B2 | 5/2022 | Sun et al. | |
| 11,502,097 | B2 | 11/2022 | Choi et al. | |
| 2012/0052674 | A1 | 3/2012 | Lee et al. | |
| 2016/0268289 | A1 | 9/2016 | Noda | |
| 2017/0053923 | A1* | 2/2017 | Hwang | H10D 1/00 |
| 2019/0348435 | A1 | 11/2019 | Nagata et al. | |
| 2020/0350326 | A1* | 11/2020 | Yun | H10B 41/10 |
| 2021/0091093 | A1 | 3/2021 | Kanamori et al. | |
| 2021/0183885 | A1* | 6/2021 | Woo | H10B 41/27 |
| 2021/0193678 | A1* | 6/2021 | Noh | H10B 41/10 |
| 2021/0288054 | A1 | 9/2021 | Ryu et al. | |
| 2021/0366922 | A1 | 11/2021 | Lee | |
| 2022/0093621 | A1 | 3/2022 | Lee | |
| 2022/0093639 | A1 | 3/2022 | Song et al. | |
| 2022/0199641 | A1* | 6/2022 | Fukuzumi | H10B 41/10 |
| 2022/0336489 | A1 | 10/2022 | Lee et al. | |

FOREIGN PATENT DOCUMENTS

| | | | | |
|---|---|---|---|---|
| JP | 2020-31149 | A | 2/2020 | |
| JP | 2020-102613 | A | 7/2020 | |
| JP | 2021-34734 | A | 3/2021 | |
| KR | 10-2012-0020552 | A | 3/2012 | |
| KR | 10-2021-0025244 | A | 3/2021 | |
| KR | 10-2021-0081051 | A | 7/2021 | |
| KR | 10-2021-0115716 | A | 9/2021 | |
| KR | 10-2022-0040846 | A | 3/2022 | |
| KR | 20220040846 | A * | 3/2022 | H10W 20/20 |
| KR | 10-2022-0144122 | A | 10/2022 | |

OTHER PUBLICATIONS

Communication dated Nov. 19, 2025, issued by the Korean Patent Office in Korean Application No. 10-2022-0087525.

Official Communication dated Aug. 4, 2026, issued by Japanese Patent Office in Japanese Patent Application No. 2023-115782.

* cited by examiner

A–A'

THREE-DIMENSIONAL MEMORY DEVICE AND ENHANCED ELECTRONIC SYSTEM

CROSS-REFERENCE TO RELATED APPLICATION

This application claims benefit of priority under 35 U.S.C. § 119 to Korean Patent Application No. 10-2022-0087525, filed on Jul. 15, 2022, in the Korean Intellectual Property Office, the disclosure of which is incorporated by reference herein in its entirety.

BACKGROUND

1. Field

The present disclosure relates generally to an integrated circuit device and an electronic system including the integrated circuit device, and more particularly, to an integrated circuit device including a vertical non-volatile memory device, and an electronic system including the integrated circuit device.

2. Description of Related Art

According to a demand for increase in performance and economic feasibility, integration of related integrated circuit devices has increased. That is, integration of an integrated circuit device, such as, but not limited to, a memory device, may be an important factor in determining the economic feasibility of a product utilizing the integrated circuit device. For example, the integration of a two-dimensional memory device may be primarily determined by an area occupied by a unit memory cell, and thus, may be significantly affected by a level of micro pattern forming technology applied to the two-dimensional memory device. However, a cost of equipment needed to form the micro pattern may be prohibitive, which may negatively impact the economic feasibility of the integrated circuit device formed using the micro pattern forming technology. Alternatively or additionally, an area of a chip die of such an integrated circuit may be limited. Consequently, although integration of two-dimensional memory devices has increased, the integration of two-dimensional memory devices is still limited.

Accordingly, there exists a need for further improvements in the integration of integrated circuit devices, as the need for increases in performance and economic feasibility continue to intensify. For example, vertical memory devices having a three-dimensional structure are desired.

SUMMARY

The present disclosure provides for an integrated circuit device in which crack defects of a word line cut may be efficiently improved without an additional process by designing part of a gate layer constituting a string select line on the word line cut to remain as a cover structure in a vertical memory device having a three-dimensional structure, and an electronic system including the integrated circuit device.

The objectives to be resolved by the technical idea are not limited to the objectives described above, and other objectives not mentioned will be clearly understood by those skilled in the art from the following description.

According to an aspect of the present disclosure, an integrated circuit device is provided. The integrated circuit device includes a semiconductor substrate including a memory cell area and a connection area, a gate stack including a plurality of word line gate layers and a plurality of insulating layers and having a step structure in the connection area, a word line cut region passing through the plurality of word line gate layers in the memory cell area and the connection area and extending in a third direction, a plurality of first channel structures disposed on the memory cell area, at least one string select line gate layer disposed on the gate stack in the memory cell area, a plurality of second channel structures passing through the at least one string select line gate layer, and a string select line cut region passing through the at least one string select line gate layer and extending in the third direction. Each of the plurality of word line gate layers and the plurality of insulating layers extend in a first direction of a main surface of the semiconductor substrate and are alternately stacked on top of each other in a second direction perpendicular to the main surface of the semiconductor substrate. Each of the plurality of first channel structures extend in the second direction and pass through the gate stack in the second direction. Each of the plurality of second channel structures extend in the second direction from the plurality of first channel structures. A portion of the at least one string select line gate layer is disposed as a cover structure overlapping the word line cut region.

According to an aspect of the present disclosure, an integrated circuit device is provided. The integrated circuit device includes a word line stack having a step structure, and a string select line stack disposed on the word line stack. The word line stack includes a memory cell area, a connection area adjacent to the memory cell area, and a plurality of word line gate layers stacked in a vertical direction. Each of the plurality of word line gate layers are separated by a plurality of word line cut regions. The string select line stack includes at least one string select line gate layer stacked in the vertical direction. Each of the at least one string select line gate layer is separated by a plurality of string select line cut regions. In a plan view, in the connection area, a cover structure is disposed in a fork shape configured to cover the plurality of word line cut regions and to expose the step structure, the cover structure comprises a same material as the at least one string select line gate layer.

According to an aspect of the present disclosure, an electronic system is provided. The electronic system includes a main substrate, an integrated circuit device on the main substrate, and a controller electrically coupled to the integrated circuit device on the main substrate. The integrated circuit device includes a semiconductor substrate including a memory cell area and a connection area, a gate stack including a plurality of word line gate layers and a plurality of insulating layers and having a step structure in the connection area, a word line cut region passing through the plurality of word line gate layers in the memory cell area and the connection area, a plurality of first channel structures disposed on the memory cell area, at least one string select line gate layer disposed on the gate stack in the memory cell area, a plurality of second channel structures passing through the at least one string select line gate layer, and a string select line cut region passing through the at least one string select line gate layer and extending in the first horizontal direction. Each of the plurality of word line gate layers and the plurality of insulating layers extend in a first horizontal direction of a main surface of the semiconductor substrate and are alternately stacked on top of each other in a vertical direction of the main surface of the semiconductor substrate. The word line cut region extends in a second horizontal direction. Each of the plurality of first channel structures extend in the vertical direction and pass through the gate stack in the vertical direction. Each of the plurality of second channel structures extend in the vertical direction from the plurality of first channel structures. A portion of the at least one string select line gate layer is disposed as a cover structure overlapping the word line cut region.

According to an aspect of the present disclosure, an integrated circuit device is provided. The integrated circuit device includes a first structure and a second structure stacked on the first structure. The first structure includes a first semiconductor substrate, a peripheral circuit disposed on the first semiconductor substrate, a first insulating layer covering the first semiconductor substrate and the peripheral circuit, and a first bonding pad disposed on the first insulating layer and electrically coupled to the peripheral circuit. The second structure includes a second semiconductor substrate including a memory cell area and a connection area adjacent to the memory cell area, a gate stack including a plurality of word line gate layers and a plurality of insulating layers and having a step structure in the connection area, a word line cut region passing through the plurality of word line gate layers in the memory cell area and the connection area, a plurality of first channel structures disposed on the memory cell area, a string select line gate layer disposed under the gate stack, a plurality of second channel structures disposed to pass through the string select line gate layer, a string select line cut region passing through the string select line gate layer and extending in a second horizontal direction, and a second bonding pad bonded to the first bonding pad. Each of the plurality of word line gate layers and the plurality of insulating layers extend in a first horizontal direction of a main surface of the second semiconductor substrate and is alternately stacked on top of each other in a vertical direction of the main surface of the second semiconductor substrate. The word line cut region extends in the second horizontal direction. Each of the plurality of first channel structures pass through the gate stack in the vertical direction. Each of the plurality of second channel structures extend in the vertical direction from the plurality of first channel structures. A portion of the string select line gate layer is disposed as a cover structure under the word line cut region. The string select line cut region is disposed on both sidewalls of the cover structure.

Additional aspects will be set forth in part in the description which follows and, in part, will be apparent from the description, or may be learned by practice of the presented embodiments.

BRIEF DESCRIPTION OF DRAWINGS

The above and other aspects, features, and advantages of certain embodiments of the present disclosure will be more apparent from the following description, taken in conjunction with the accompanying drawings, in which.

DETAILED DESCRIPTION

Figure 1:
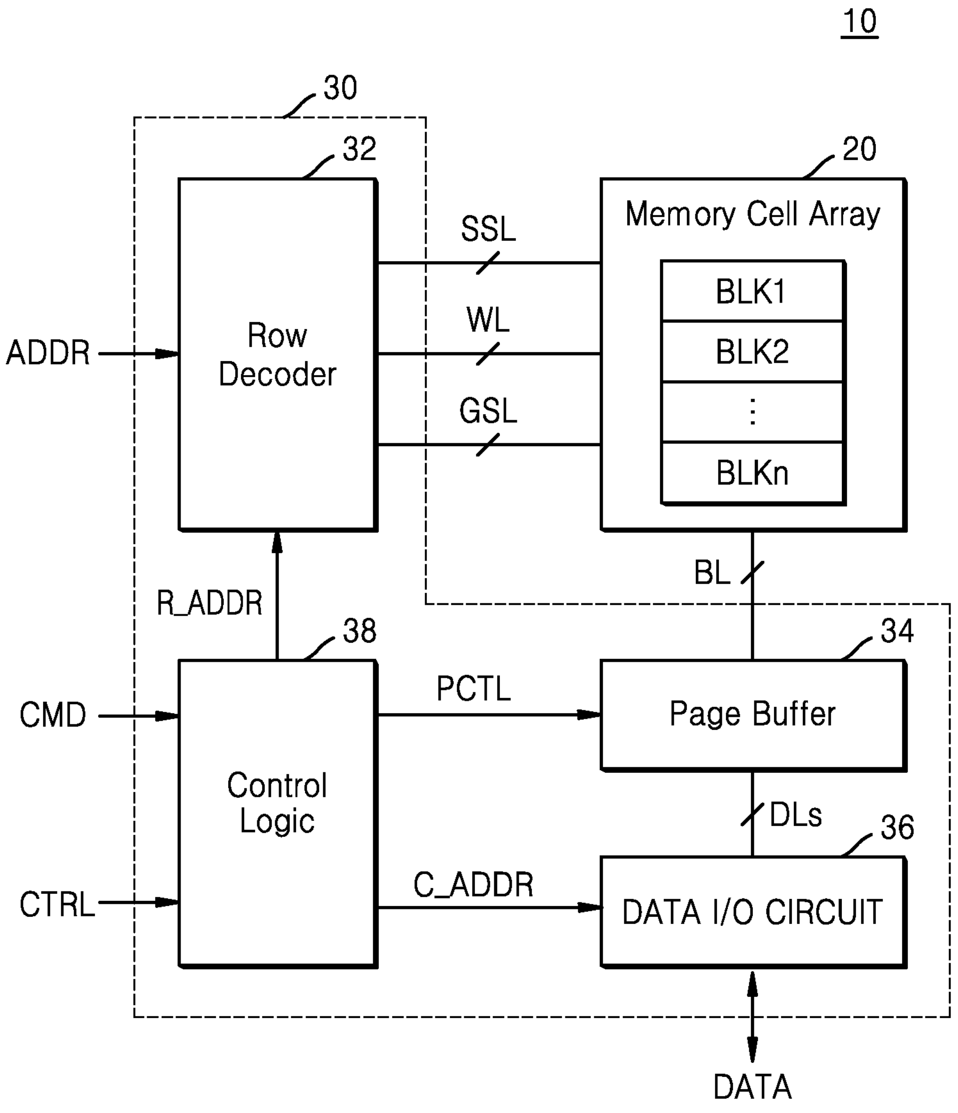
FIG. 1 is a block diagram of an integrated circuit device, according to an embodiment.

The following description with reference to the accompanying drawings is provided to assist in a comprehensive understanding of embodiments of the present disclosure defined by the claims and their equivalents. Various specific details are included to assist in understanding, but these details are considered to be exemplary only. Therefore, those of ordinary skill in the art will recognize that various changes and modifications of the embodiments described herein can be made without departing from the scope and spirit of the disclosure. In addition, descriptions of well-known functions and structures are omitted for clarity and conciseness.

With regard to the description of the drawings, similar reference numerals may be used to refer to similar or related elements. It is to be understood that a singular form of a noun corresponding to an item may include one or more of the things, unless the relevant context clearly indicates otherwise. As used herein, expressions such as "at least one of" when preceding a list of elements, modify the entire list of elements and do not modify the individual elements of the list. For example, "at least one of a, b, and c" should be understood as including only a, only b, only c, both a and b, both a and c, both b and c, or all of a, b, and c. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wired), wirelessly, or via a third element.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present.

The terms "upper," "middle", "lower", etc. may be replaced with terms, such as "first," "second," third" to be used to describe relative positions of elements. The terms "first," "second," third" may be used to described various elements but the elements are not limited by the terms and a "first element" may be referred to as a "second element". Alternatively or additionally, the terms "first", "second", "third", etc. may be used to distinguish components from each other and do not limit the present disclosure. For example, the terms "first", "second", "third", etc. may not necessarily involve an order or a numerical meaning of any form.

Reference throughout the present disclosure to "one embodiment," "an embodiment," "an example embodiment," or similar language may indicate that a particular feature, structure, or characteristic described in connection with the indicated embodiment is included in at least one embodiment of the present solution. Thus, the phrases "in one embodiment", "in an embodiment," "in an example embodiment," and similar language throughout this disclosure may, but do not necessarily, all refer to the same embodiment.

Hereinafter, embodiments are described in detail with reference to the accompanying drawings.

FIG. 1 is a block diagram of an integrated circuit device 10, according to an embodiment.

Referring to FIG. 1, the integrated circuit device 10 may include a memory cell array 20 and a peripheral circuit 30.

The memory cell array 20 may include a plurality of memory cell blocks BLK1, BLK2, . . . , BLKn (hereinafter "BLK" generally), where n is an integer greater than 1. Each of the plurality of memory cell blocks BLK may include a plurality of memory cells (not shown). The plurality of memory cell blocks BLK may be connected to the peripheral circuit 30 through a bit line BL, a word line WL, a string select line SSL, and a ground select line GSL.

The memory cell array 20 may be connected (e.g., coupled) to a page buffer 34 via the bit line BL and/or may be connected to a row decoder 32 through the word line WL, the string select line SSL, and the ground select line GSL. In the memory cell array 20, each of the plurality of memory cells included in the plurality of memory cell blocks BLK may include a flash memory cell. The memory cell array 20 may include a three-dimensional memory cell array. The three-dimensional memory cell array may include a plurality of negative-AND (NAND) strings, and each of the plurality of NAND strings may include a plurality of memory cells respectively connected to a plurality of word lines WL that may be vertically stacked.

The peripheral circuit 30 may include the row decoder 32, the page buffer 34, a data input/output (I/O) circuit 36, and a control logic 38. Although not shown, the peripheral circuit 30 may further include various circuits, such as a voltage generation circuit configured to generate various voltages necessary for operations of the integrated circuit device 10, an error correction circuit configured to correct errors of data read from the memory cell array 20, an I/O interface, and the like.

The peripheral circuit 30 may receive an address ADRR, a command CMD, and a control signal CTRL from outside of the integrated circuit device 10 (e.g., an external device, a memory controller, a processor, and the like) and transmit and/or receive data DATA to and/or from a device outside the integrated circuit device 10. The elements of the peripheral circuit 30 are described in detail below.

The row decoder 32 may select at least one of the plurality of memory cell blocks BLK in response to the address ADRR from outside (e.g., external device) and select the word line WL, the string select line SSL, and the ground select line GSL of the selected memory cell block. For example, the row decoder 32 may transfer a voltage for performing a memory operation to the word line WL of the selected memory cell block.

The page buffer 34 may be connected to the memory cell array 20 through the bit line BL. The page buffer 34 may operate as a write driver during a program (e.g., write) operation and apply, to the bit line BL, a voltage according to the data DATA to be stored in the memory cell array 20. Alternatively or additionally, the page buffer 34 may operate as a detection amplifier during a read operation and detect the data DATA stored in the memory cell array 20. In some embodiments, the page buffer 34 may operate according to a control signal PCTL received from the control logic 38.

The data I/O circuit 36 may be connected to the page buffer 34 through data lines DLs. During the program operation, the data I/O circuit 36 may receive the data DATA from the external device (e.g., a memory controller) and provide the program data DATA to the page buffer 34 based on a column address C_ADDR received from the control logic 38. Alternatively or additionally, during the read operation, the data I/O circuit 36 may provide the data DATA stored in the page buffer 34 to the memory controller based on the column address C_ADDR received from the control logic 38. In some embodiments, the data I/O circuit 36 may be configured to transfer a received address and/or instruction to the control logic 38 and/or the row decoder 32.

The control logic 38 may receive the command CMD and the control signal CTRL from the external device (e.g., a memory controller). The control logic 38 may provide a row address R_ADDR to the row decoder 32 and/or provide the column address C_ADDR to the data I/O circuit 36. The control logic 38 may generate, in response to the control signal CTRL, various internal control signals to be used within the integrated circuit device 10. For example, when a memory operation, such as, but not limited to, a program operation and/or an erase operation, is performed, the control logic 38 may adjust a level of a voltage provided to the word line WL and the bit line BL.

The number and arrangement of components shown in FIG. 1 are provided as an example. In practice, there may be additional components, fewer components, different components, or differently arranged components than those shown in FIG. 1. Furthermore, two or more components shown in FIG. 1 may be implemented within a single component, or a single component shown in FIG. 1 may be implemented as multiple, distributed components.

Figure 2:
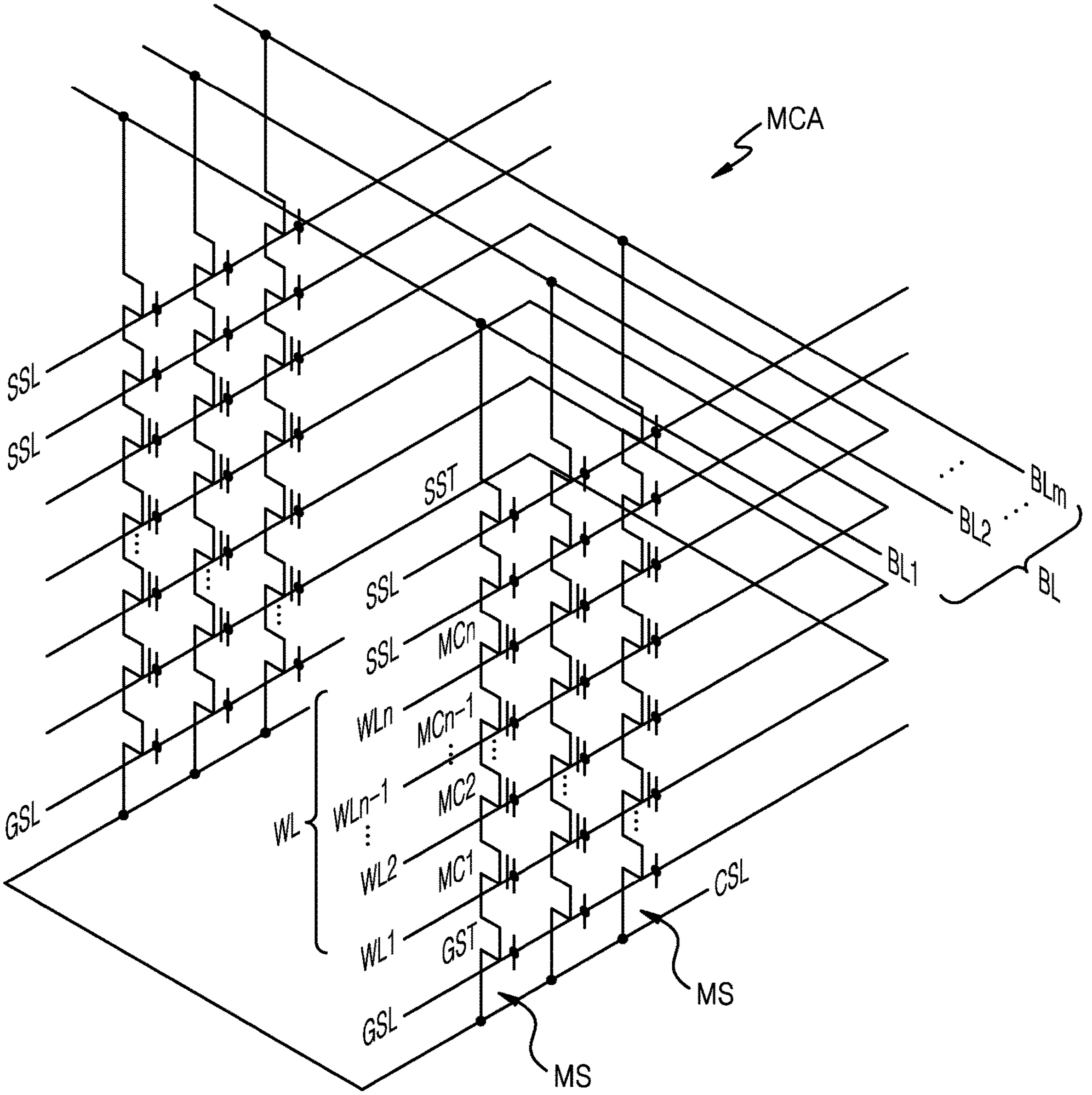
FIG. 2 is an equivalent circuit diagram of a memory cell array of the integrated circuit device, according to an embodiment.

FIG. 2 is an equivalent circuit diagram of a memory cell array of the integrated circuit device 10, according to an embodiment.

Referring to FIG. 2, an equivalent circuit diagram of a vertical NAND flash memory device having a vertical channel structure is shown as an example.

The memory cell array MCA of FIG. 2 may include or may be similar in many respects to the memory cell array 20 described above with reference to FIG. 1, and may include additional features not mentioned above.

The memory cell array MCA may include a plurality of memory cell strings MS. The memory cell array MCA may further include a plurality of bit lines BL (e.g., first bit line BL1, second bit line BL2, . . . , and m-th bit line BLm, where m is an integer greater than 1), a plurality of word lines WL (e.g., first word line WL1, second word line WL2, . . . , and n-th word line WLn, where n is an integer greater than 1), at least one string select line SSL, at least one ground select line GSL, and a common source line CSL.

The plurality of memory cell strings MS may be formed between the plurality of bit lines BL and the common source line CSL. Referring to FIG. 2, each of the plurality of memory cell strings MS may include two string select lines SSL. However, the present disclosure is not limited thereto. For example, each of the plurality of memory cell strings MS may include a single string select line SSL. For another example, each of the plurality of memory cell strings MS may include more than two string select lines SSL (e.g., three or more).

Each of the plurality of memory cell strings MS may include a string select transistor SST, a ground select transistor GST, and a plurality of memory cell transistors MC (e.g., first memory cell transistor MC1, second memory cell transistor MC2, . . . , nth−1 first memory cell transistor MCn−1, and n-th memory cell transistor MCn, where n is an integer greater than 1). A drain region of the string select transistor SST may be connected to the bit line BL, and a source region of the ground select transistor GST may be connected to the common source line CSL. The common source line CSL may be an area to which source regions of the plurality of ground select transistors GST are commonly connected.

The string select transistor SST may be connected to the string select line SSL, and the ground select transistor GST may be connected to the ground select line GSL. The plurality of memory cell transistors MC may be connected to the plurality of word lines WL, respectively.

Figure 3:
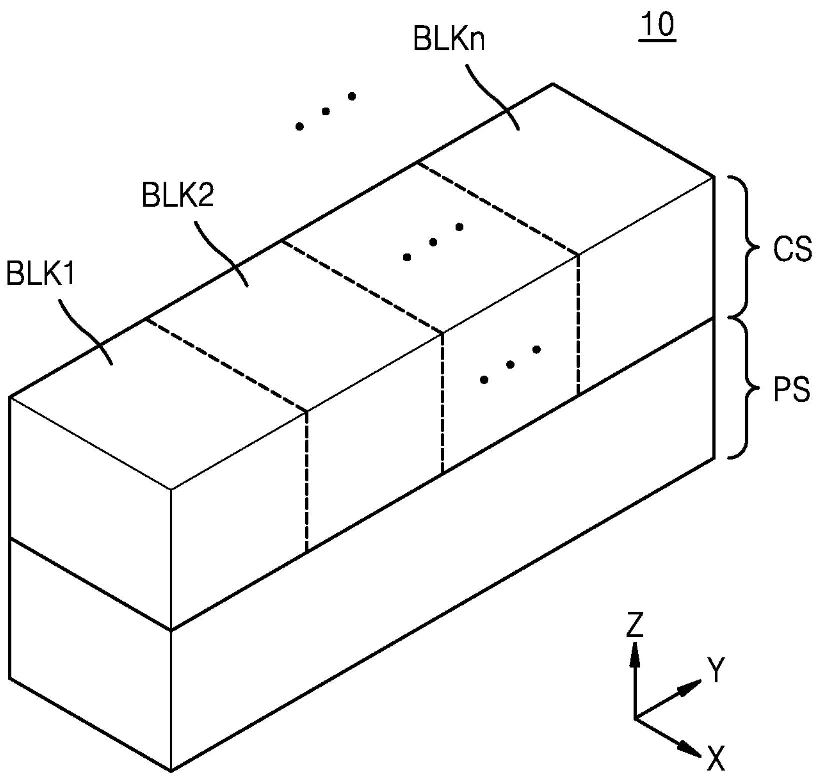
FIG. 3 is a schematic perspective view of the integrated circuit device, according to an embodiment.

FIG. 3 is a schematic perspective view of the integrated circuit device 10, according to an embodiment.

Referring to FIG. 3, the integrated circuit device 10 may include a memory cell array structure CS and a peripheral circuit structure PS that overlap each other in a vertical direction (e.g., a Z direction).

The memory cell array structure CS may include or may be similar in many respects to at least one of the memory cell array 20 described above with reference to FIG. 1 and the memory cell array MCA described above with reference to FIG. 2, and may include additional features not mentioned above. The peripheral circuit structure PS may include or may be similar in many respects to the peripheral circuit 30 described above with reference to FIG. 1, and may include additional features not mentioned above.

The memory cell array structure CS may include a plurality of tiles. The plurality of tiles may include the plurality of memory cell blocks BLK, respectively. The plurality of memory cell blocks BLK may respectively include memory cells arranged three-dimensionally.

In some embodiments, two tiles may constitute a single mat. However, the present disclosure is not limited thereto. For example, the memory cell array 20 described with reference to FIG. 1 may include a plurality of mats.

Figure 4:
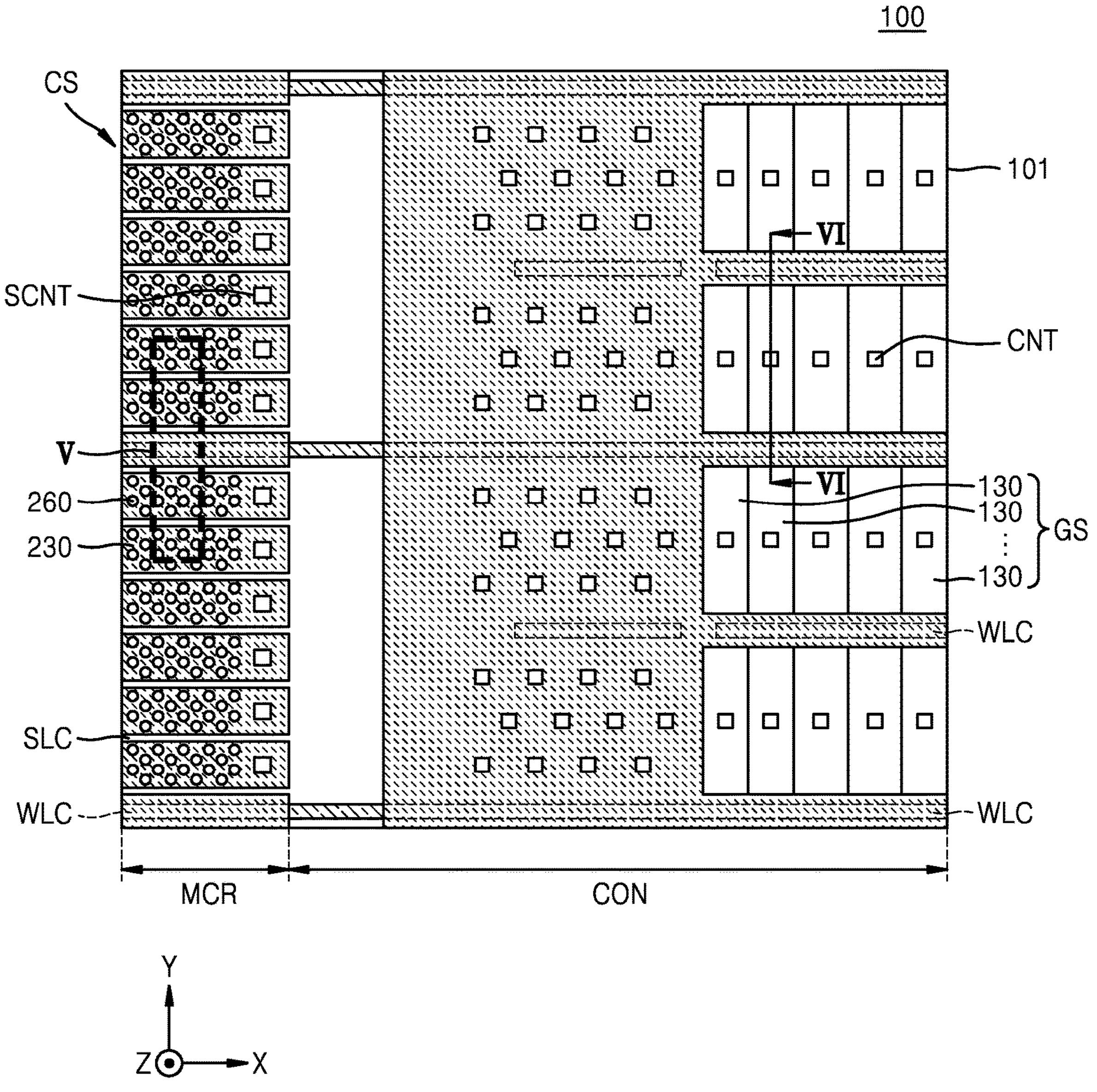
FIG. 4 is a plan view illustrating elements of an integrated circuit device, according to an embodiment.

FIG. 4 is a plan view illustrating elements of an integrated circuit device 100, according to an embodiment.

The integrated circuit device 100 of FIG. 4 may include or may be similar in many respects to the integrated circuit device 10 described above with reference to FIGS. 1 to 3, and may include additional features not mentioned above.

Figure 5:
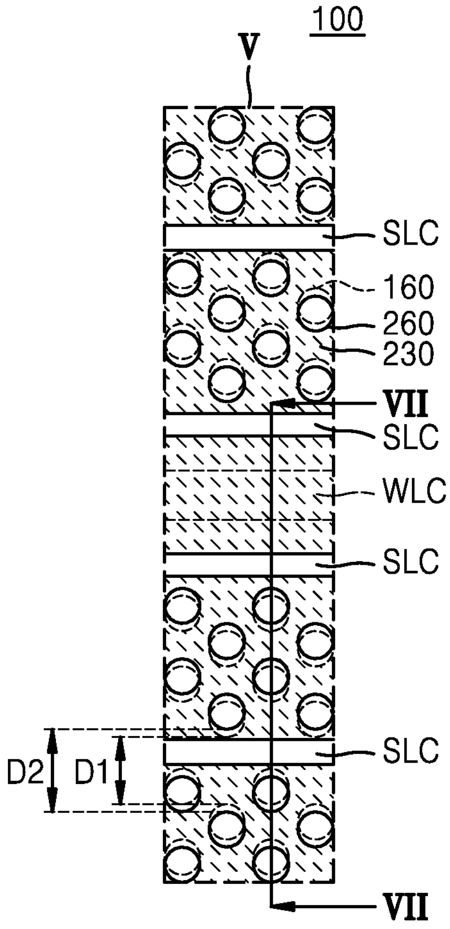
FIG. 5 is an enlarged diagram of region V in FIG. 4, according to an embodiment.
Figure 6:
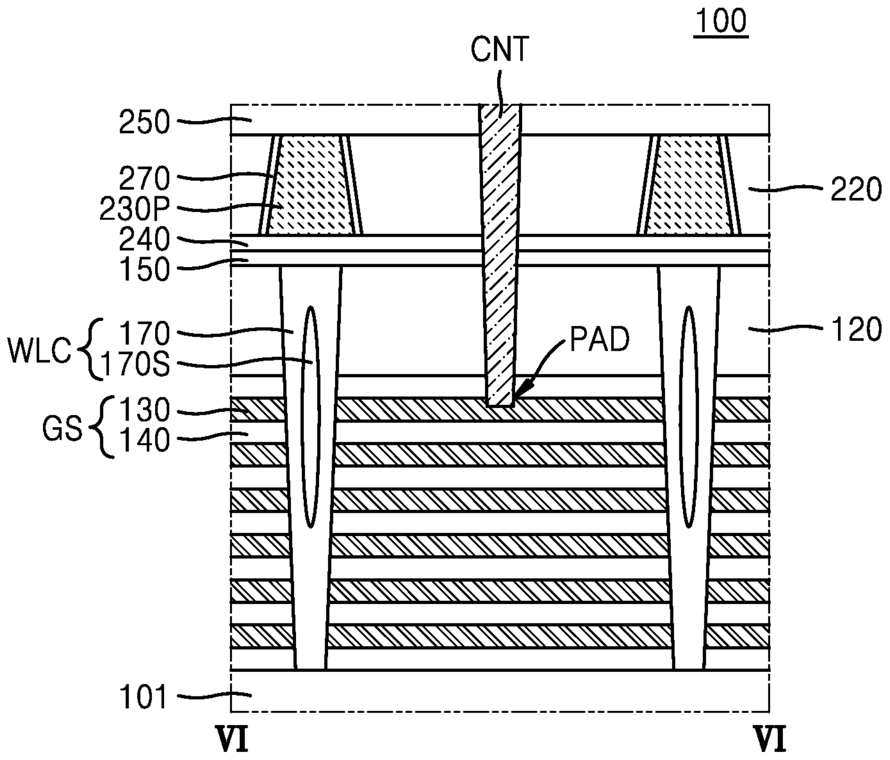
FIG. 6 is a cross-sectional view of the integrated circuit device, taken along line VI-VI in FIG. 4, according to an embodiment.
Figure 7:
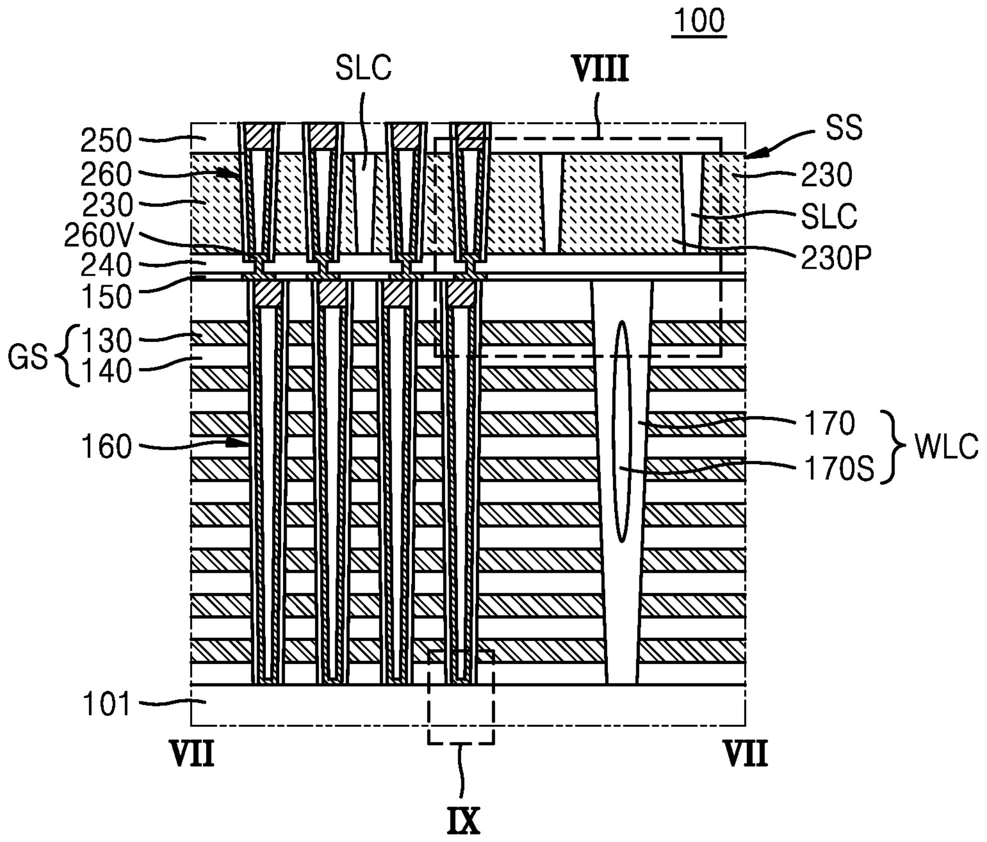
FIG. 7 is a cross-sectional view of the integrated circuit device, taken along line VII-VII in FIG. 5, according to an embodiment.
Figure 8:
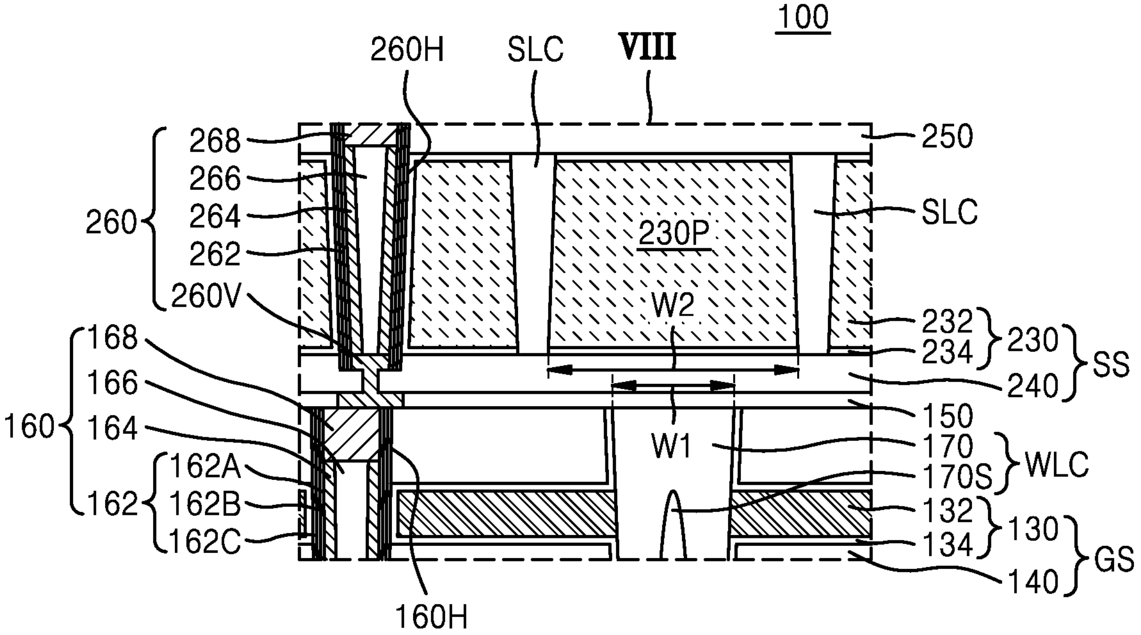
FIG. 8 is an enlarged diagram of region VIII in FIG. 7, according to an embodiment.
Figure 9:
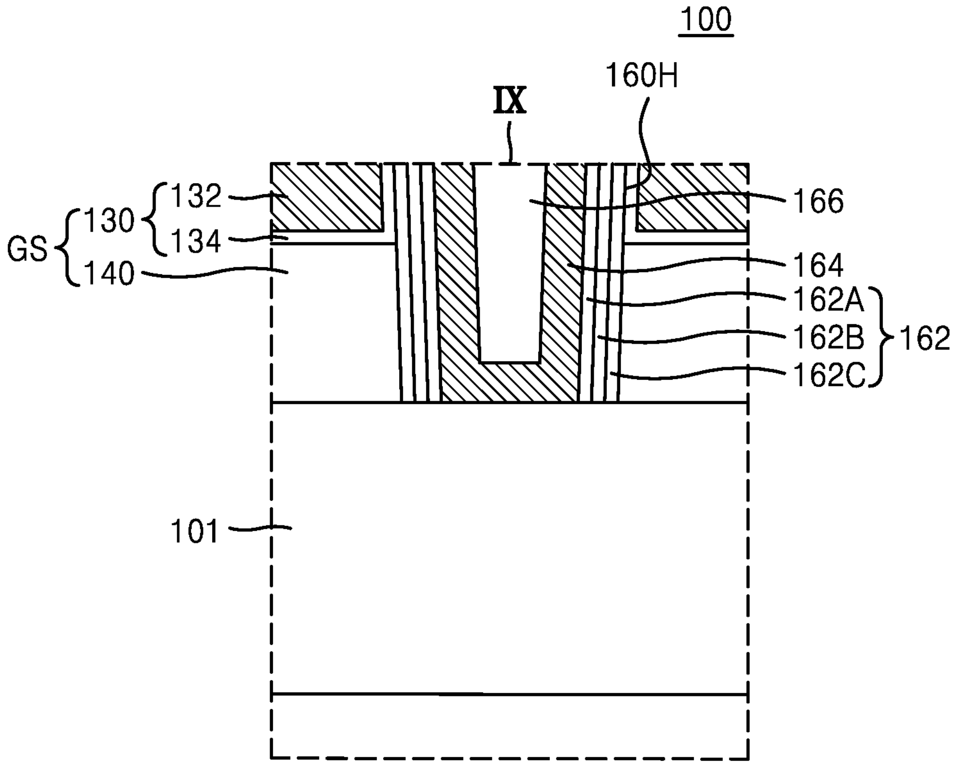
FIG. 9 is an enlarged diagram of region IX in FIG. 7, according to an embodiment.

To more specifically describe the integrated circuit device 100 of FIG. 4, FIG. 5 illustrates an enlarged diagram of region V in FIG. 4, FIG. 6 illustrates a cross-sectional view of the integrated circuit device 100, taken along line VI-VI in FIG. 4, FIG. 7 illustrates a cross-sectional view of the integrated circuit device 100, taken along line VII-VII in FIG. 5, FIG. 8 illustrates an enlarged diagram of region VIII in FIG. 7, and FIG. 9 illustrates an enlarged diagram of region IX in FIG. 7.

Referring to FIGS. 4 to 9 together, the integrated circuit device 100 may include a memory cell area MCR and a connection area CON.

The memory cell area MCR may be an area in which a memory cell array is formed, such as, but not limited to, the memory cell array MCA described above with reference to FIG. 2. The connection area CON may be an area in which a pad unit PAD is formed. The pad unit PAD may be configured to provide an electrical connection (e.g., coupling) between the memory cell array MCA formed in the memory cell area MCR and a peripheral circuit area (not shown).

A semiconductor substrate 101 may include a semiconductor material, such as a Group IV semiconductor, a Group III-V compound semiconductor, or a Group II-VI oxide semiconductor. For example, the Group IV semiconductor may include silicon (Si), germanium (Ge), or SiGe. The semiconductor substrate 101 may be provided as a bulk wafer and/or a wafer on which an epitaxial layer is formed. In some embodiments, the semiconductor substrate 101 may include a silicon on insulator (SOI) or germanium on insulator (GeOI).

A gate stack GS may extend in a first direction (e.g., an X direction) and a second direction (e.g., a Y direction) on the semiconductor substrate 101. The first direction may be parallel to a main surface of the semiconductor substrate 101. The gate stack GS may include a plurality of gate layers 130 and a plurality of insulating layers 140. The plurality of gate layers 130 and the plurality of insulating layers 140 may be alternately arranged in a third direction (e.g., a Z direction) that is perpendicular to an upper surface of the semiconductor substrate 101. Alternatively or additionally, an upper insulating layer 150 may be disposed at an uppermost portion of the gate stack GS.

Each gate layer of the plurality of gate layers 130 may include a buried conductive layer 132 and an insulating liner 134 surrounding upper, bottom, and lateral surfaces of the buried conductive layer 132 (as shown in FIGS. 8 and 9). In some embodiments, the buried conductive layer 132 may include, but not be limited to, a metal (e.g., tungsten (W)), a metal silicide (e.g., tungsten silicide (WSi)), a doped polysilicon, and/or any combinations thereof. In optional or additional embodiments, the insulating liner 134 may include, but not be limited to, a high-K dielectric material (e.g., aluminum oxide).

The plurality of gate layers 130 may correspond to the ground select line GSL and the word lines WL included in the memory cell string MS described above with reference to FIG. 2. For example, the gate layer 130 that is lowermost may function as the ground select line GSL, and the remaining gate layers 130 may function as the word lines WL. According to such functions, the gate stack GS may be referred to as a word line stack.

A plurality of word line cuts WLC may extend in the first direction (e.g., the X direction) on the semiconductor substrate 101. The gate stack GS arranged between a pair of word line cuts WLC may constitute a single block, and the pair of word line cuts WLC may limit a width of the gate stack GS in the second direction (e.g., the Y direction). The word line cut WLC may include an insulating separation layer 170 and a seam 170S that is an empty space in the insulating separation layer 170.

A plurality of first channel structures 160 may extend in the third direction (e.g., the Z direction) through the gate stack GS from the upper surface of the semiconductor substrate 101 in the memory cell area MCR. The plurality of first channel structures 160 may be arranged apart from each other at certain intervals in the first direction (e.g., the X direction) and the second direction (e.g., the Y direction). For example, the plurality of first channel structures 160 may be arranged in a zigzag and/or a staggered shape. In some embodiments, a level of an uppermost end of the plurality of first channel structures 160 and a level of an uppermost level of the word line cut WLC may be substantially equal to each other.

The plurality of first channel structures 160 may be formed to extend in a first channel hole 160H passing through the gate stack GS. Each of the plurality of first channel structures 160 may include a gate insulating layer 162, a channel layer 164, a buried insulating layer 166, and a conductive plug 168. The gate insulating layer 162 and the channel layer 164 may be sequentially disposed on a sidewall of the first channel hole 160H. For example, the gate insulating layer 162 may be conformally disposed on the sidewall of the first channel hole 160H, and the channel layer 164 may be conformally disposed on the sidewall and a bottom portion of the first channel hole 160H. The buried insulating layer 166 filling a remaining space of the first channel hole 160H may be disposed on the channel layer 164. The conductive plug 168, which is in contact with the channel layer 164 and blocks an entrance (e.g., the uppermost end) of the first channel hole 160H, may be disposed at an upper portion of the first channel hole 160H.

The plurality of first channel structures 160 may be in contact with the semiconductor substrate 101. In some embodiments, the channel layer 164 may be arranged to be in contact with the upper surface of the semiconductor substrate 101 at a bottom portion of the first channel hole 160H. In other embodiments, a contact semiconductor layer (not shown) having a height from the bottom portion of the first channel hole 160H on the semiconductor substrate 101 may be formed, and the channel layer 164 may be electrically connected to the semiconductor substrate 101 through the contact semiconductor layer.

The gate insulating layer 162 may have a structure sequentially including a tunneling dielectric layer 162A, a charge storage layer 162B, and a blocking dielectric layer 162C on an outer sidewall of the channel layer 164. Relative thicknesses of the tunneling dielectric layer 162A, the charge storage layer 162B, and the blocking dielectric layer 162C included in the gate insulating layer 162 are not limited to those shown (e.g., FIGS. 8 and 9) and may be variously modified without deviating from the scope of the present disclosure.

The tunneling dielectric layer 162A may include, but not be limited to, at least one of silicon oxide, hafnium oxide, aluminum oxide, zirconium oxide, tantalum oxide, and the like. The charge storage layer 162B may be an area in which electrons passing through the tunneling dielectric layer 162A from the channel layer 164 may be stored. The charge storage layer 162B may include, but not be limited to, at least one of silicon nitride, boron nitride, silicon boron nitride, and polysilicon doped with impurities. The blocking dielectric layer 162C may include, but not be limited to, at least one of silicon oxide, silicon nitride, and a metal oxide having a greater permittivity than silicon oxide.

A string select line stack SS may be disposed over the gate stack GS on the semiconductor substrate 101. The string select line stack SS may include at least one second gate layer 230 and at least one second insulating layer 240. The second gate layer 230 and the second insulating layer 240 may be alternately arranged in the third direction (e.g., the Z direction) perpendicular to the upper surface of the semiconductor substrate 101. Alternatively or additionally, a second upper insulating layer 250 may be disposed at an uppermost portion of the string select line stack SS.

The second gate layer 230 may include a second buried conductive layer 232 and a second insulating liner 234 surrounding upper, bottom, and lateral surfaces of the second buried conductive layer 232 (e.g., as shown in FIG. 8). In some embodiments, the second gate layer 230 may include at least one of a single-layer structure of polysilicon, a stacked structure of oxide/polysilicon, and a stacked structure of oxide/metal, but is not limited thereto.

A plurality of second channel structures 260 may extend in the third direction (e.g., the Z direction) through the string select line stack SS. The plurality of second channel structures 260 may be arranged apart from each other at certain intervals in the first direction (e.g., the X direction) and/or the second direction (e.g., the Y direction). The plurality of second channel structures 260 may be arranged in a zigzag and/or a staggered shape. The plurality of second channel structures 260 may be arranged to be electrically connected to the plurality of first channel structures 160 through a connection via 260V.

The plurality of second channel structures 260 may be formed to extend in a second channel hole 260H passing through the string select line stack SS. Each of the plurality of second channel structures 260 may include a second gate insulating layer 262, a second channel layer 264, a second buried insulating layer 266, and a second conductive plug 268.

Referring to FIG. 5, a first distance D1 between the plurality of first channel structures 160 adjacent to each other may be less than a second distance D2 between the plurality of second channel structures 260 that are adjacent to each other with a string select line cut SLC therebetween. Because the plurality of second channel structures 260 include the string select line cut SLC therebetween, the plurality of second channel structures 260 may be sufficiently apart from each other by the second distance D2.

Continuing to refer to FIG. 5, in a plan view, a first central axis of the first channel structure 160 and a second central axis of the second channel structure 260 positioned on the first channel structure 160 may be arranged in a staggered manner. In some embodiments, the second central axis of the second channel structure adjacent to the word line cut WLC from among the plurality of second channel structures 260 may be arranged to be biased toward the word line cut WLC.

In the memory cell area MCR, the plurality of string select line cuts SLC passing through the string select line stack SS and extending in the first direction (e.g., the X direction) may be arranged. The plurality of string select line cuts SLC may be implemented as an insulating structure 270.

In the integrated circuit device 100 of the present disclosure, a portion of the second gate layer 230, which is an area defined by the string select line cut SLC, may be present in an overlapping manner on the word line cut WLC as a cover structure 230P.

In some embodiments, the word line cut WLC may have an inverted trapezoidal shape in which a horizontal width decreases as a distance from a main surface of the semiconductor substrate 101 decreases. The cover structure 230P disposed on the word line cut WLC in an overlapping manner may extend in the first direction (e.g., the X direction) and may have a trapezoidal shape in which a horizontal width increases as a distance from the main surface of the semiconductor substrate 101 decreases.

In some embodiments, the string select line cut SLC may have an inverted trapezoidal shape in which a horizontal width decreases as a distance from the main surface of the semiconductor substrate 101 decreases. The string select line cut SLC may be arranged (e.g., disposed) at opposite sidewalls of the cover structure 230P. That is the cover structure 230P may be an area defined by the string select line cut SLC.

The cover structure 230P may be part of the second gate layer 230. As a result, the cover structure 230P may include substantially the same material as the second gate layer 230. That is the cover structure 230P may include, but not be limited to, at least one of a single-layer structure of polysilicon, a stacked structure of oxide/polysilicon, and a stacked structure of oxide/metal.

In some embodiments, a horizontal width W1 of an uppermost end of the word line cut WLC may be less than a horizontal width W2 of a lowermost end of the cover structure 230P. That is the word line cut WLC may be entirely covered by the cover structure 230P. Accordingly, the seam 170S, which is formed in the word line cut WLC, and the cover structure 230P may completely overlap each other in the third direction (e.g., the Z direction).

In the connection area CON, the gate layer 130 may extend and constitute the pad unit PAD at an end of the gate layer 130, and a cover insulating layer 120 covering the pad unit PAD may be arranged. In the connection area CON, the plurality of gate layers 130 may extend to have a shorter length in the first direction (e.g., the X direction) as a distance from the upper surface of the semiconductor substrate 101 decreases in the third direction (e.g., the Z direction). That is in the connection area CON, the plurality of gate layers 130 may have a step structure. In some embodiments, a second cover insulating layer 220 may be disposed on the cover insulating layer 120.

In the connection area CON, a contact plug CNT connected to the pad unit PAD of the gate layer 130 through the cover insulating layer 120 may be arranged. The contact plug CNT may have a tapered pillar shape, of which a width decreases in the third direction (e.g., the Z direction) from an upper area to a lower area. In some embodiments, a second contact plug SCNT connected to the second gate layer 230 in the memory cell area MCR may be arranged to correspond to the contact plug CNT.

When the integrated circuit device 100 of the present disclosure is viewed in a plan view, in the connection area CON, the cover structure 230P may expose the step structure and may be arranged to cover the word line cut WLC. That is the cover structure 230P may be arranged in a fork shape in the connection area CON.

In general, with the development of semiconductor process technology, an aspect ratio (e.g., a height-to-width-ratio) of the word line cut WLC may increase as a height of the gate stack GS increases. In particular, the aspect ratio of the word line cut WLC may further increase in a structure in which a plurality of gate layers 130 are included in the gate stack GS. In this case, the possibility may increase that a defect in which cracks occur along the seam 170S in the word line cut WLC where the insulating separation layer 170 is not formed.

To potentially avoid the defects described above, in the integrated circuit device 100 of the present disclosure, a vertical memory device having a three-dimensional structure is designed such that a portion of the second gate layer 230 constituting a string select line remains as the cover structure 230P over the word line cut WLC. Accordingly, the cover structure 230P may improve the structural stability of the word line cut WLC so that cracks in the word line cut WLC may be avoided.

Furthermore, in the integrated circuit device 100 according to the present disclosure, the cover structure 230P disposed on the word line cut WLC may be formed without an additional process by using a portion of the second gate layer 230 constituting a string select line. As such, the cover structure 230P may be manufactured without incurring an increase in manufacturing costs and/or reducing a probability of structural defects from ocurring.

Consequently, the integrated circuit device 100, according to the present disclosure, may improve on the economic feasibility, productivity, and reliability of a product when compared to related integrated circuit devices.

Figure 10:
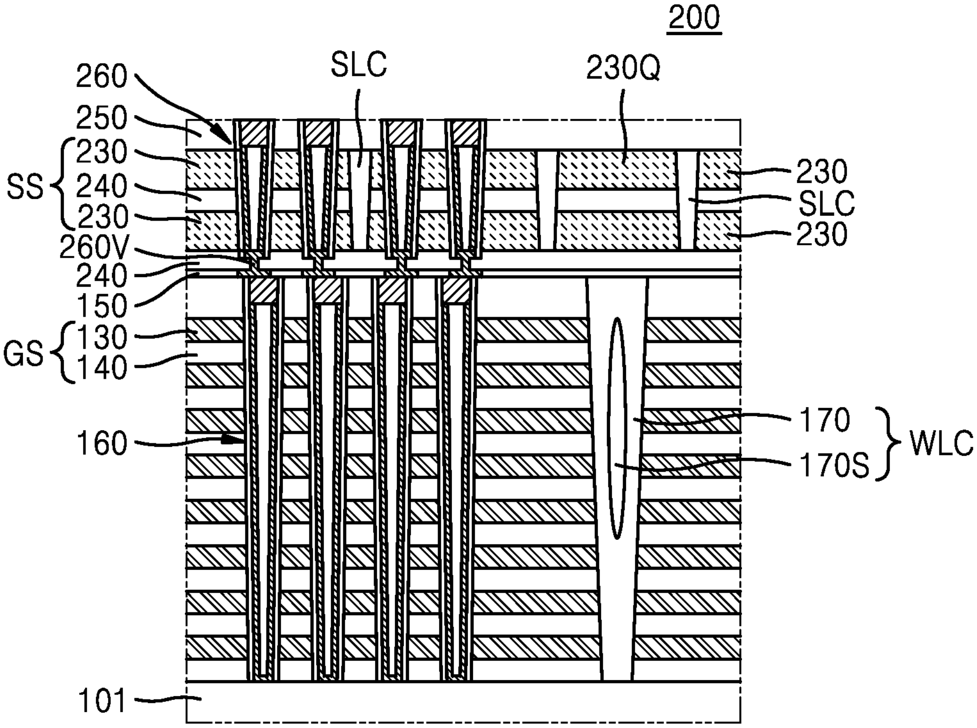
FIGS. 10 to 12 are cross-sectional views of the integrated circuit device, according to an embodiment.
Figure 11:
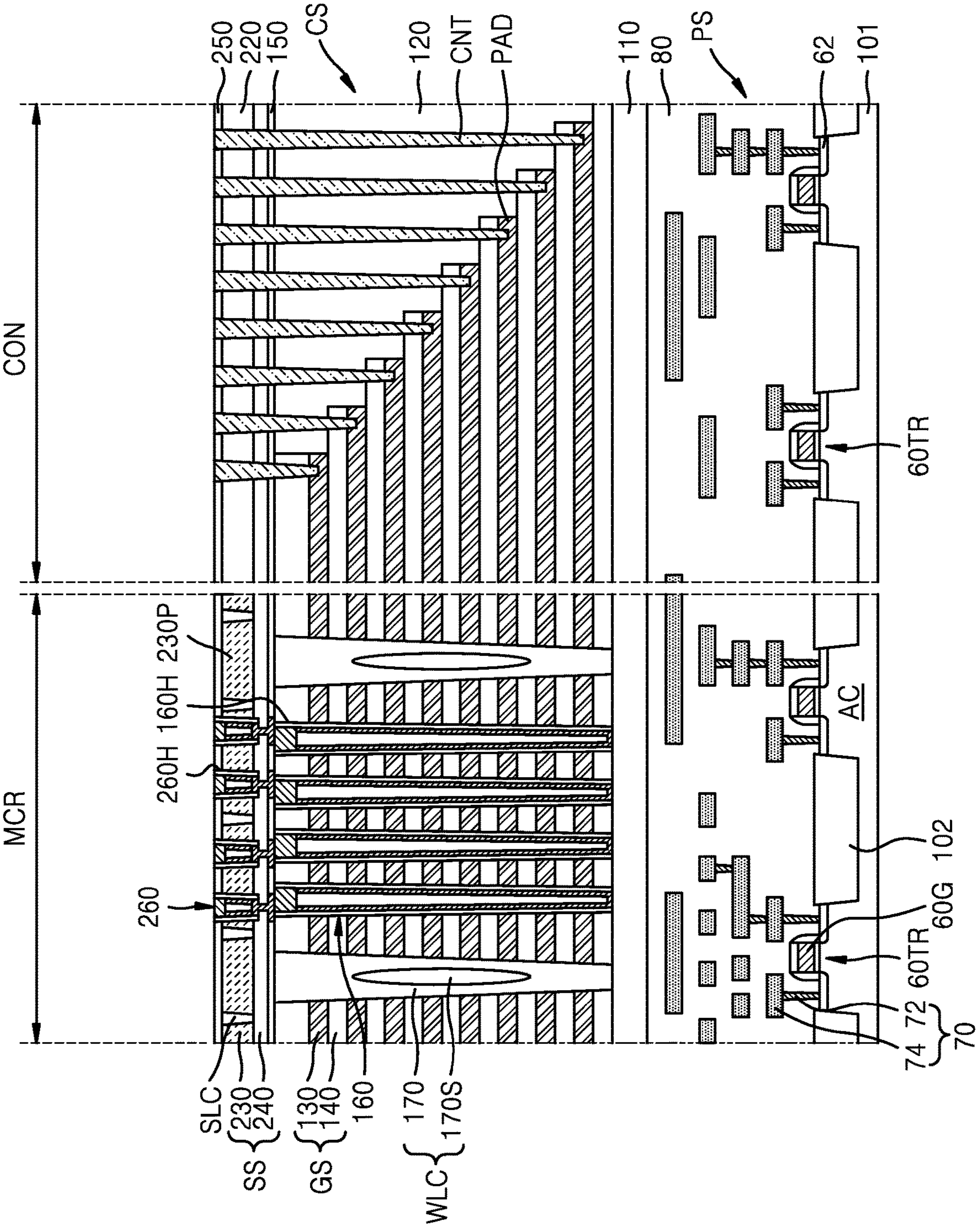
Figure 12:
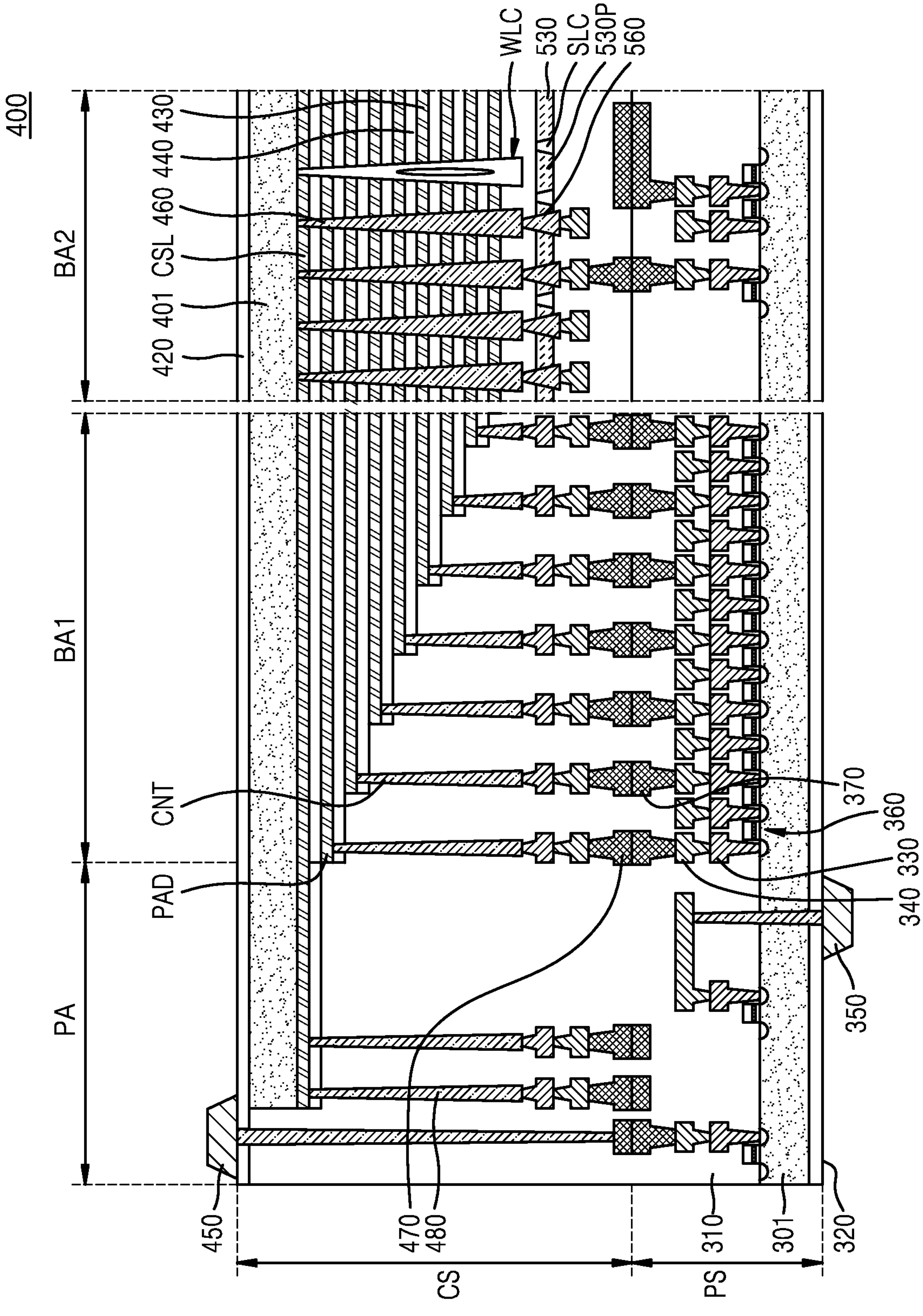

FIGS. 10 to 12 are cross-sectional views of the integrated circuit device, according to an embodiment.

Most elements of integrated circuit devices 200, 300, and 400 described below with reference to FIGS. 10 to 12, respectively, and materials included in these elements may be substantially the same as and/or similar to those described above with reference to FIGS. 4 to 9, and may include additional features not mentioned above. Accordingly, for convenience of explanation, differences from the integrated circuit device 100 described above are mainly described.

Referring to FIG. 10, the integrated circuit device 200 may include the plurality of second gate layers 230 and the plurality of second insulating layers 240 on the memory cell area MCR. The plurality of second gate layers 230 and the plurality of second insulating layers 240 may be alternately arranged with each other in the third direction (e.g., the Z direction) perpendicular to the upper surface of the semiconductor substrate 101. Accordingly, in the integrated circuit device 200, a portion of the plurality of second gate layers 230 may be present as a cover structure 230Q in an overlapping manner on the word line cut WLC.

The cover structure 230Q may be part of the plurality of second gate layers 230. As a result, the cover structure 230Q may include substantially the same multi-layer structure as the plurality of second gate layers 230. That is, the cover structure 230Q may include, but not be limited to, at least one of a multi-layer structure of polysilicon, a multi-layer structure of oxide/polysilicon, and a multi-layer structure of oxide/metal.

Referring to FIG. 11, the integrated circuit device 300 may include the peripheral circuit structure PS and the memory cell array structure CS disposed at a vertical level greater than that of the peripheral circuit structure PS.

The integrated circuit device 300 may have a cell on periphery (COP) structure, in which the memory cell array structure CS is disposed on the peripheral circuit structure PS. A base structure 110 may be located between the peripheral circuit structure PS and the memory cell array structure CS.

The peripheral circuit structure PS may include a peripheral circuit transistor and a peripheral circuit line 70 on the semiconductor substrate 101. In the semiconductor substrate 101, an active area AC may be defined by a device separation film 102, and a plurality of peripheral circuit transistors 60TR may be formed on the active area AC. The plurality of peripheral circuit transistors 60TR may include a peripheral circuit gate and source/drain regions 62. The source/drain regions 62 may be respectively arranged at portions of the semiconductor substrate 101 at opposite sides of peripheral circuit gate 60G.

The peripheral circuit line 70 may include a plurality of peripheral circuit contacts 72 and a plurality of peripheral circuit metal layers 74. An interlayer insulating layer covering the peripheral circuit transistor 60TR and the peripheral circuit line 70 may be disposed on the semiconductor substrate 101. The plurality of peripheral circuit metal layers 74 may have a multi-layer structure including, but not limited to, a plurality of metal layers at different vertical levels. In FIG. 11, the plurality of peripheral circuit metal layers 74 are illustrated as being formed at the same height. However, the present disclosure is not limited in this regard. For example, the peripheral circuit metal layer 74 disposed at a level (e.g., disposed at the uppermost level) may be formed at a greater height than those of the peripheral circuit metal layers 74 disposed at the remaining levels.

Referring to FIG. 12, the integrated circuit device 400 may include a chip to chip bonding structure.

The integrated circuit device 400 of the present embodiment includes a chip-to-chip bonding structure, in which an upper chip including the memory cell array structure CS and a lower chip including the peripheral circuit structure PS are manufactured and then, the upper chip and the lower chip are connected to each other by a bonding method.

In some embodiments, the bonding method may denote a method in which a first bonding pad formed at an uppermost portion of the lower chip located at the bottom and a second bonding pad formed at a lowermost portion of the upper chip located at the top are in contact with each other. The bonding method may include, but is not limited to, metal-metal bonding, through silicon via (TSV), back via stack (BVS), eutectic bonding, ball grid array (BGA) bonding, a plurality of wiring lines, or any combinations thereof.

The peripheral circuit structure PS may include a first substrate 301, an interlayer insulating layer 310, a plurality of circuit devices 360, first metal layers 330 respectively connected to the plurality of circuit devices 360, and a second metal layer 340 formed on the first metal layer 330. The interlayer insulating layer 310 may be disposed on the first substrate 301 to cover the plurality of circuit devices 360, the first metal layer 330, and the second metal layer 340. In some embodiments, the interlayer insulating layer 310 may include an insulating material.

A lower bonding pad 370 may be formed on the second metal layer 340 of a word line bonding area BA1. In the word line bonding area BA1, a first bonding pad 370 of the peripheral circuit structure PS may be electrically connected to a second bonding pad 470 of the memory cell array structure CS by a bonding method.

The memory cell array structure CS may provide at least one memory block. The memory cell array structure CS may include a second substrate 401 and the common source line CSL. A plurality of word lines 430 and a plurality of insulating layers 440 may be stacked in the third direction (e.g., the Z direction) on the second substrate 401. In addition, at least one string select line 530 may be disposed on the second substrate 401.

In a bit line bonding area BA2, a first channel structure 460 may pass through the word lines 430, the insulating layers 440, and a ground select line in the third direction (e.g., the Z direction). Alternatively or additionally, a second channel structure 560 may pass through the string select line 530.

In the integrated circuit device 400, as shown in FIG. 12, the string select line 530 may be disposed under the word lines 430. Alternatively or additionally, a portion of the string select line 530 may be present as a cover structure 530P in an overlapping manner under the word line cut WLC.

In the word line bonding area BA1, the word lines 430 may extend parallel to an upper surface of the second substrate 401 and be connected to the plurality of contact plugs CNT. The word lines 430 and the contact plugs CNT may be connected to each other in the pad unit PAD, in which at least a portion of the word lines 430 may be provided to extend by different lengths.

A common source line contact 480 may be arranged in an external pad bonding area PA. The common source line contact 480 may be formed of a conductive material, such as, but not limited to, a metal, a metal compound, or polysilicon. The common source line contact 480 may be electrically connected to the second bonding pad 470.

In some embodiments, the first I/O pad 350 and the second I/O pad 450 may be arranged in the external pad bonding area PA. A lower layer 320 covering a lower surface of the first substrate 301 may be formed under the first substrate 301, and the first I/O pad 350 may be formed on the lower layer 320. An upper layer 420 covering the upper surface of the second substrate 401 may be formed on the second substrate 401, and the second I/O pad 450 may be disposed on the upper layer 420.

Figure 13:
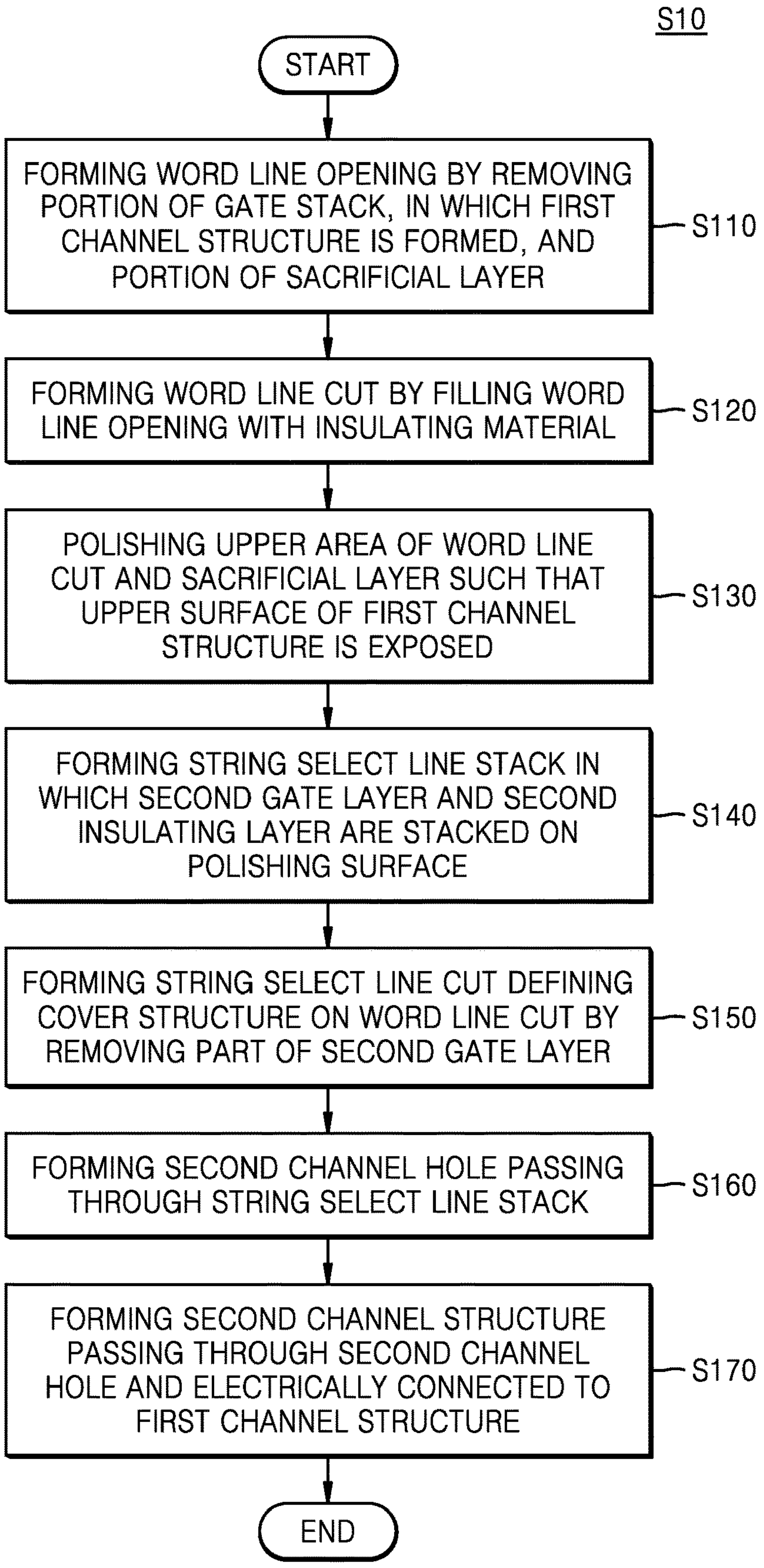
FIG. 13 is a flowchart of a method of manufacturing an integrated circuit device, according to an embodiment.

FIG. 13 is a flowchart of a method S10 of manufacturing an integrated circuit device, according to an embodiment.

When a certain embodiment may be implemented differently, a specific process order may be performed differently from the described order. For example, two consecutively described processes may be performed substantially at the same time or performed in an order opposite to the described order.

Referring to FIG. 13, the method S10 of manufacturing the integrated circuit device may include a process order of first to seventh operations S110 to S170.

The method S10 of manufacturing the integrated circuit device, according to the present disclosure, may include a first operation S110 of forming a word line opening by removing a portion of a gate stack in which a first channel structure is formed and a portion of a sacrificial layer, a second operation S120 of forming a word line cut by filling the word line opening with an insulating material, a third operation S130 of polishing an upper area of the word line cut and the sacrificial layer such that an upper surface of the first channel structure is exposed, a fourth operation S140 of forming a string select line stack in which a second gate layer and a second insulating layer are stacked on a polishing surface, a fifth operation S150 of forming a string select line cut defining a cover structure on the word line cut by removing part of the second gate layer, a sixth operation S160 of forming a second channel hole passing through the string select line stack, and a seventh operation S170 of forming a second channel structure passing through the second channel hole and electrically connected to the first channel structure.

Technical features of each of the first to seventh operations S110 to S170 are described in detail below with reference to FIGS. 14A to 14G.

FIGS. 14A to 14G are cross-sectional views illustrating a method of manufacturing an integrated circuit device according to a process order, according to an embodiment.

Figure 14A:
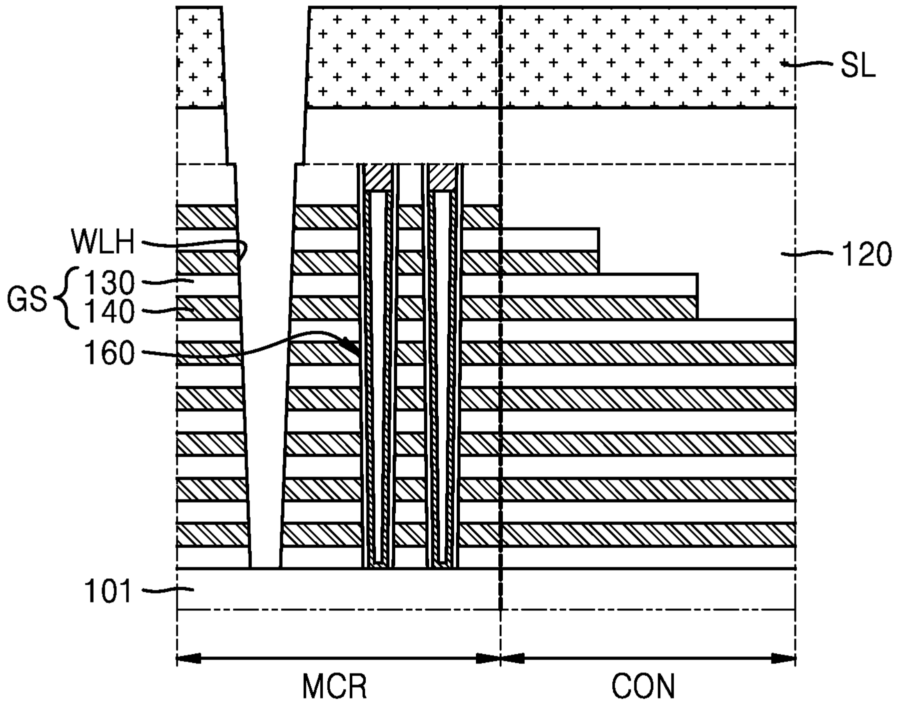
FIGS. 14A to 14G are cross-sectional views illustrating a method of manufacturing an integrated circuit device according to a process order, according to an embodiment.

Referring to FIG. 14A, a word line opening may be formed by removing a portion of a gate stack, on which a first channel structure is formed, and a portion of a sacrificial layer.

To briefly explain the process shown, the gate stack GS may be formed on the semiconductor substrate 101. Next, in the gate stack GS, the first channel hole 160H may be formed by removing a portion of the memory cell area MCR. Next, the first channel structure 160 may be formed on an inner wall of the first channel hole 160H. Next, a sacrificial layer SL may be formed on the gate stack GS.

In the structure formed as described above, a word line opening WLH may be formed by removing a portion of the gate stack GS and a portion of the sacrificial layer SL. The plurality of gate layers 130 may be formed by removing a plurality of mold layers (not shown) exposed by a sidewall of the word line opening portion WLH and burying a conductive material in a space thus obtained. That is a replacement process may be performed in which the plurality of mold layers are substituted with the conductive material to form the plurality of gate layers 130.

Figure 14B:
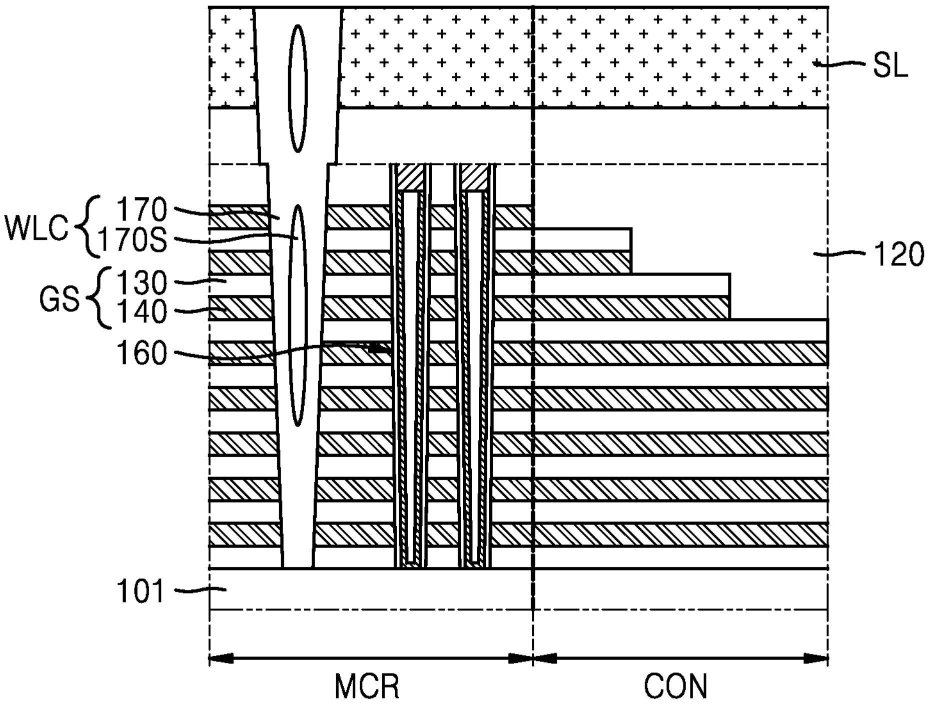

Referring to FIG. 14B, the word line cut WLC may be formed by filling the word line opening WLH with an insulating material.

The word line cut WLC may include the insulating separation layer 170. In some embodiments, the insulating separation layer 170 may include, but not be limited to, a silicon oxide, a silicon nitride, a silicon oxynitride, or a low-dielectric material. Here, the seam 170S that is an empty space may be included in the insulating separation layer 170.

Figure 14C:
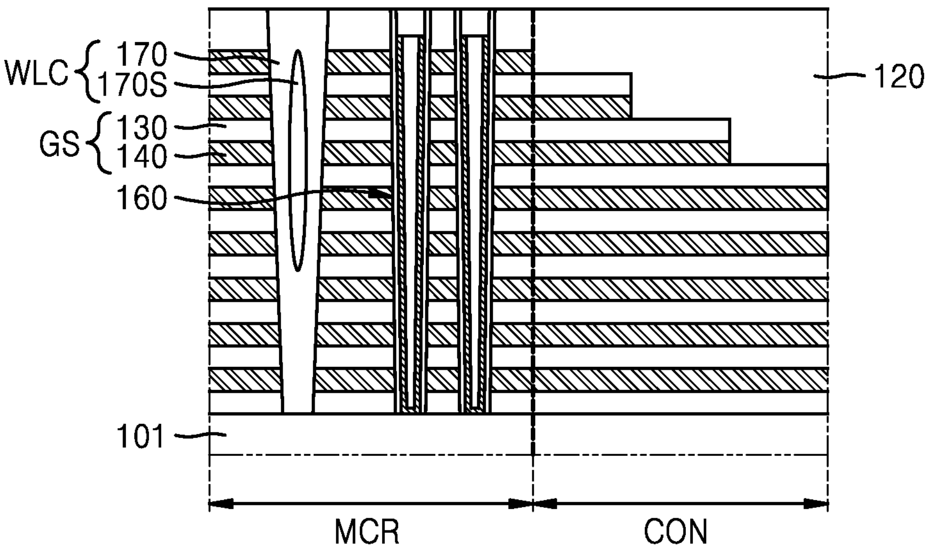

Referring to FIG. 14C, the sacrificial layer SL (see FIG. 14B) and an upper area of the word line cut WLC may be polished such that an upper surface of the first channel structure 160 is exposed.

The polishing process may include removing the sacrificial layer SL (see FIG. 14B) by using an etch-back process and/or a chemical mechanical polishing (CMP) process.

Through the polishing process, a level of an uppermost surface of the first channel structure 160 and a level of an uppermost surface of the word line cut WLC may be formed to be substantially equal to each other.

Figure 14D:
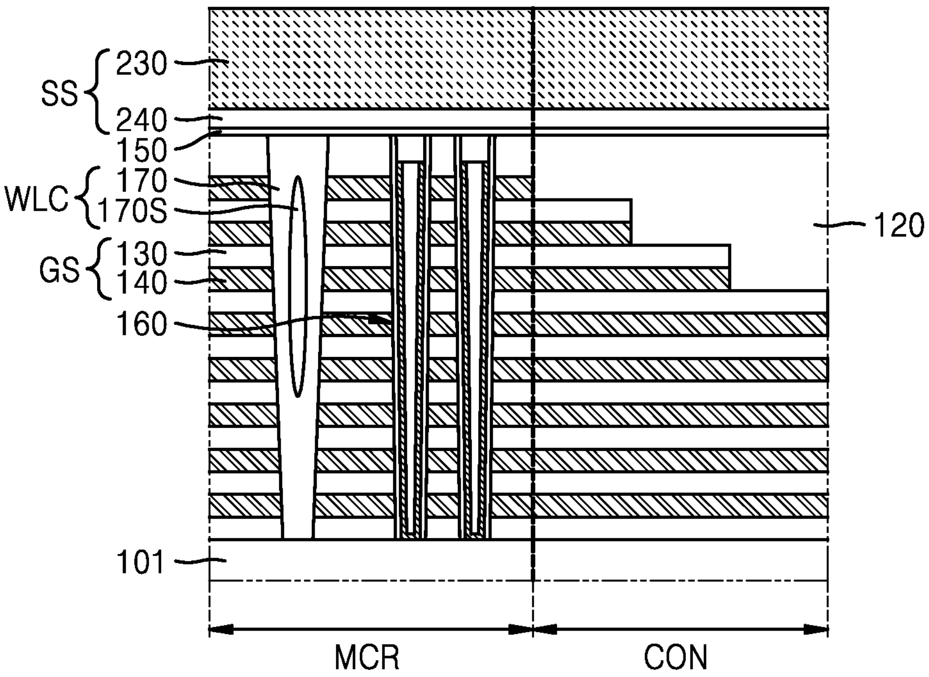

Referring to FIG. 14D, the string select line stack SS may be formed in which at least one second gate layer 230 and at least one second insulating layer 240 are stacked on the polished surface.

The at least one second gate layer 230 may include a single-layer structure of polysilicon, a stacked structure of oxide/polysilicon, or a stacked structure of oxide/metal, but is not limited thereto. Alternatively or additionally, the at least one second insulating layer 240 may include silicon oxide, but is not limited thereto.

Figure 14E:
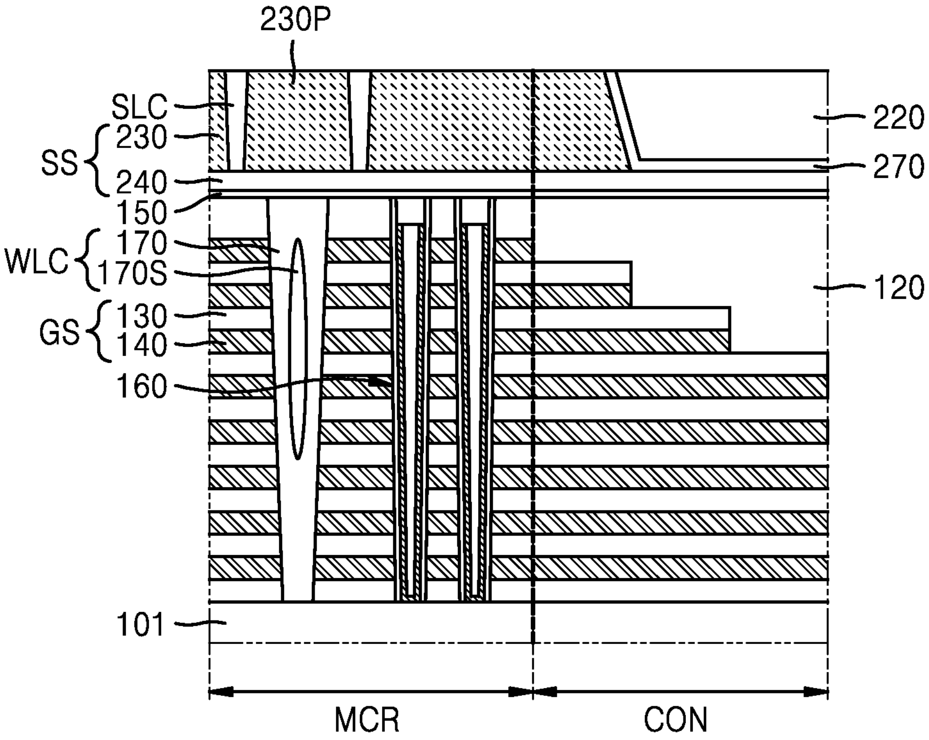

Referring to FIG. 14E, a portion of the second gate layer 230 may be removed, and the string select line cut SLC defining the cover structure 230P may be formed on the word line cut WLC.

In the memory cell area MCR, the plurality of string select line cuts SLC passing through the string select line stack SS and extending in the first direction (e.g., the X direction) may be formed. The plurality of string select line cuts SLC may be implemented as an insulating structure 270.

By the formation process of the string select line cut SLC, the word line cut WLC has an inverted trapezoidal shape, of which a horizontal width decreases as a distance from the main surface of the semiconductor substrate 101 decreases. Alternatively or additionally, the cover structure 230P arranged to be on the word line cut WLC in an overlapping manner may extend in the first direction (e.g., the X direction) and may have a trapezoidal shape, of which a horizontal width increases as a distance from the main surface of the semiconductor substrate 101 decreases.

The cover structure 230P may be formed between adjacent string select line cuts SLC. That is the cover structure 230P may be an area defined by the string select line cuts SLC.

By using the manufacturing process described above, in the integrated circuit device 100 according to the present disclosure, the cover structure 230P disposed on the word line cut WLC may be formed by using a portion of the second gate layer 230 included in a string select line without an additional process.

Figure 14F:
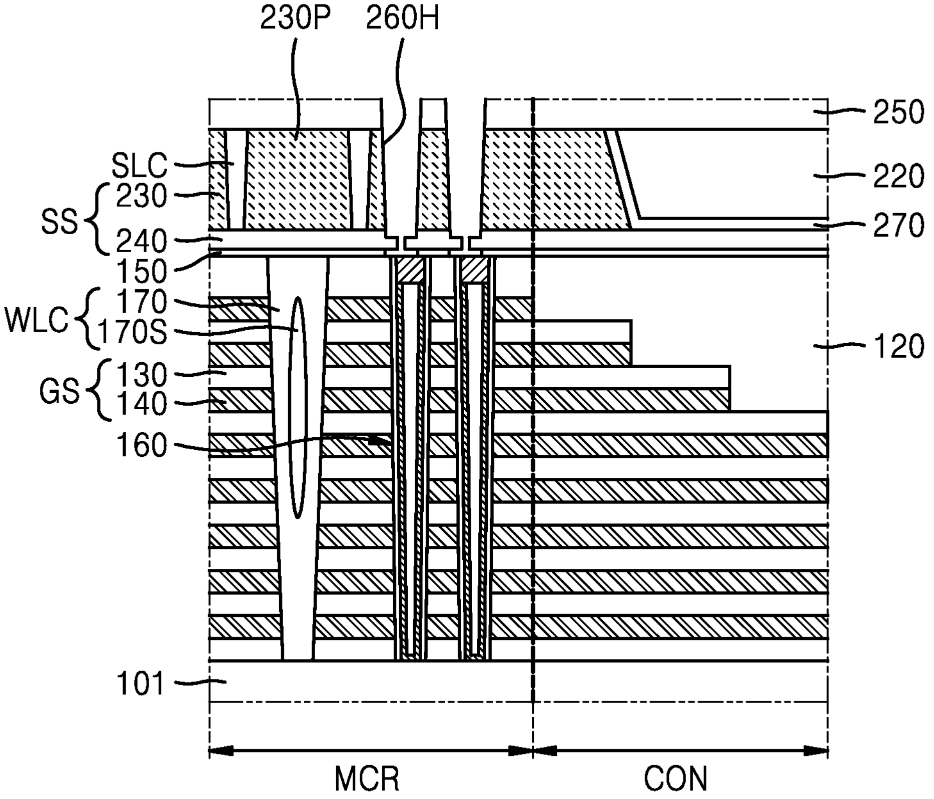

Referring to FIG. 14F, a plurality of second channel holes 260H passing through the string select line stack SS may be formed.

A mask pattern (not shown) may be formed on the string select line stack SS by using a photolithography process, and the plurality of second channel holes 260H may be formed by using the mask pattern as an etching mask.

The plurality of second channel holes 260H may be formed such that both sidewalls thereof have a concave-convex structure, through various steps of an etching process. That is, the plurality of second channel holes 260H may be formed such that the uppermost surface of the first channel structure 160 is exposed through the plurality of second channel holes 260H.

After the formation process of the plurality of second channel holes 260H described above, the mask pattern may be removed by an ashing and stripping processes.

Figure 14G:
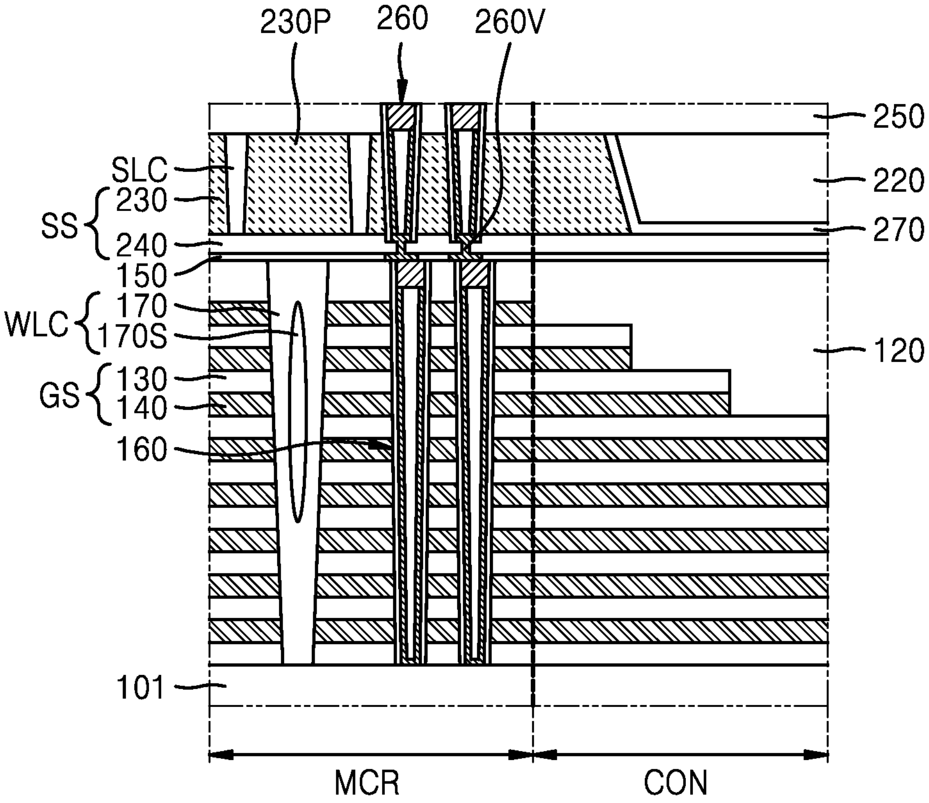

Referring to FIG. 14G, the second channel structure 260 may be formed, whereby the second channel structure 260 may be filling the second channel hole 260H and may be electrically connected to the first channel structure 160.

The plurality of second channel structures 260 may be formed to extend in the third direction (e.g., the Z direction) through the string select line stack SS. The plurality of second channel structures 260 may be arranged in a zigzag shape and/or a staggered shape. The plurality of second channel structures 260 may be formed to be electrically connected to the plurality of first channel structures 160 through the connection via 260V.

Alternatively or additionally, a first central axis of the first channel structure 160 and a second central axis of the second channel structure 260 located on the first channel structure 160 may be formed in a staggered manner. In some embodiments, the second central axis of the second channel structure 260 adjacent to the word line cut WLC from among the plurality of second channel structures 260 may be formed to be biased toward the word line cut WLC.

By using the method of manufacturing an integrated circuit device as described above, the integrated circuit device 100 according to the present disclosure, may be designed such that a portion of the second gate layer 230 on the word line cut WLC remains as the cover structure 230P in a vertical memory device having a three-dimensional structure, and thus, a defect of cracks in the word line cut WLC may be improved without an additional process.

Figure 15:
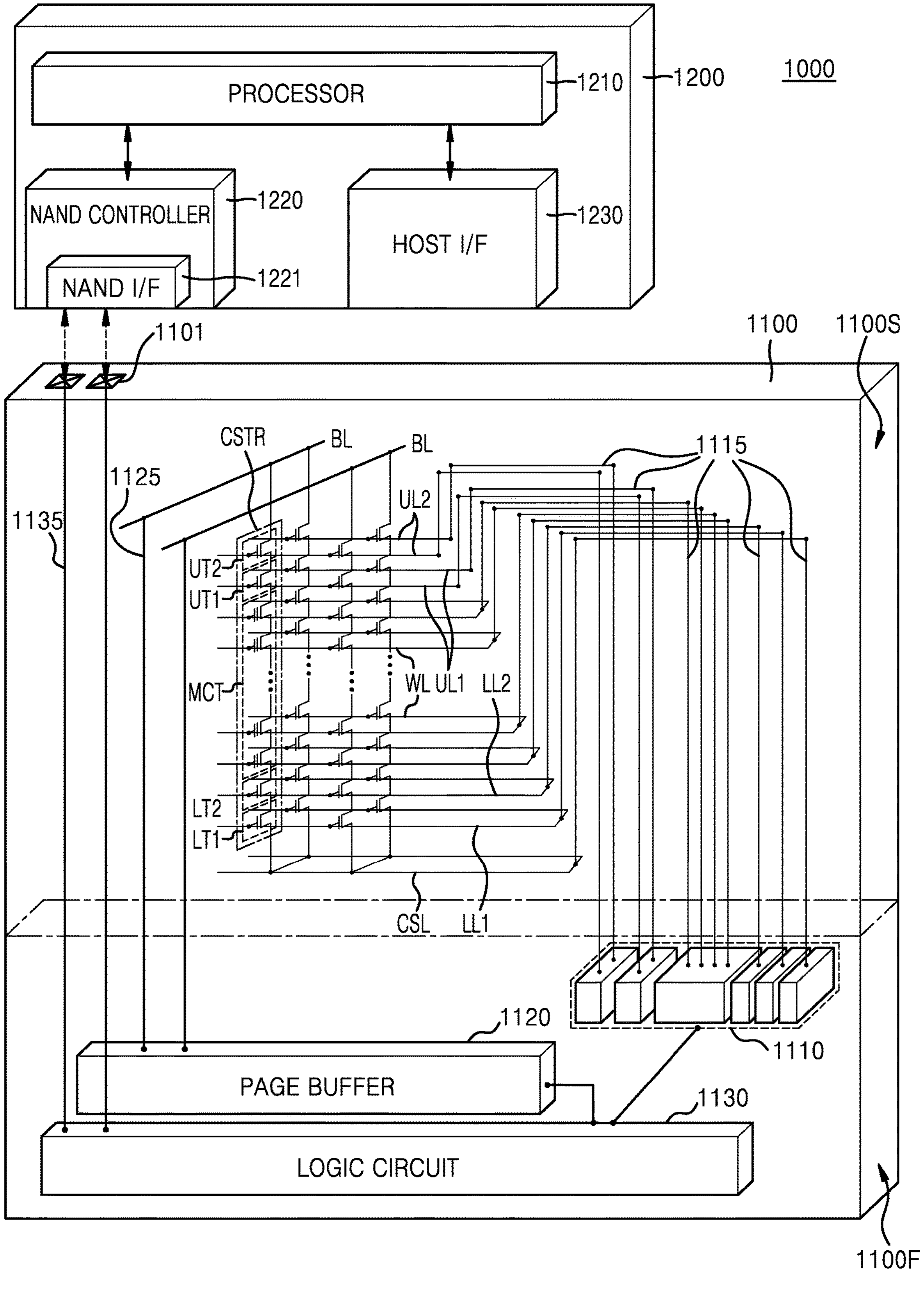
FIG. 15 is a diagram illustrating an electronic system including an integrated circuit device, according to an embodiment.

FIG. 15 is a diagram illustrating an electronic system 1000 including an integrated circuit device 1100, according to an embodiment.

Referring to FIG. 15, the electronic system 1000, according to the present disclosure, may include the integrated circuit device 1100 and a controller 1200 electrically connected to the integrated circuit device 1100.

The electronic system 1000 may be a storage device including one or more integrated circuit devices 1100 and/or may be an electronic apparatus including the storage device. For example, the electronic system 1000 may be a solid state drive (SSD) device, a universal serial bus (USB) device, a computing system, a medical device, or a communication device that includes the at least one integrated circuit device 1100.

The integrated circuit device 1100 may be a vertical non-volatile memory device. For example, the integrated circuit device 1100 may be a NAND flash memory device including at least one of the integrated circuit devices 100, 200, 300, and 400 described above with reference to FIGS. 4 to 12. The integrated circuit device 1100 may include a first structure 1100F and a second structure 1100S on the first structure 1100F. In some embodiments, the first structure 1100F may be arranged next to the second structure 1100S.

The first structure 1100F may be a peripheral circuit structure including a decoder circuit 1110, a page buffer 1120, and a logic circuit 1130. The second structure 1100S may be a memory cell structure including the bit line BL, the common source line CSL, the plurality of word lines WL, first and second gate upper lines UL1 and UL2, first and second gate lower lines LL1 and LL2, and a plurality of memory cell strings CSTR arranged between the bit line BL and the common source line CSL.

In the second structure 1100S, each of the plurality of memory cell strings CSTR may include lower transistors LT1 and LT2, upper transistors UT1 and UT2, and a plurality of memory cell transistors MCT, wherein the lower transistors LT1 and LT2 are adjacent to the common source line CSL, wherein the upper transistors UT1 and UT2 are adjacent to the bit line BL, and wherein the plurality of memory cell transistors MCT are arranged between the lower transistors LT1 and LT2 and the upper transistors UT1 and UT2. The number of lower transistors LT1 and LT2 and the number of upper transistors UT1 and UT2 may be variously modified.

In some embodiments, the upper transistors UT1 and UT2 may include a string select transistor, and the lower transistors LT1 and LT2 may include a ground select transistor. The plurality of gate lower lines LL1 and LL2 may be gate layers of the lower transistors LT1 and LT2, respectively. The word line WL may be a gate layer of the memory cell transistor MCT, and the gate upper lines UL1 and UL2 may be gate layers of the upper transistors UT1 and UT2, respectively.

The common source line CSL, the plurality of gate lower lines LL1 and LL2, the plurality of word lines WL, and the plurality of gate upper lines UL1 and UL2 may be electrically connected to the decoder circuit 1110 through a plurality of first connection lines 1115. The plurality of first connection lines 1115 may each extend to the second structure 1100S in the first structure 1100F. The plurality of bit lines BL may be electrically connected to the page buffer 1120 through a plurality of second connection lines 1125. The plurality of second connection lines 1125 may each extend to the second structure 1100S in the first structure 1100F.

In the first structure 1100F, the decoder circuit 1110 and the page buffer 1120 may each execute a control operation for at least one of the plurality of memory cell transistors MCT. The decoder circuit 1110 and the page buffer 1120 may each be controlled by the logic circuit 1130.

The integrated circuit device 1100 may communicate with the controller 1200 through an I/O pad 1101 that may be electrically connected to the logic circuit 1130. The I/O pad 1101 may be electrically connected to the logic circuit 1130 through an I/O connection line 1135 extending to the second structure 1100S in the first structure 1100F.

The controller 1200 may include a processor 1210, a NAND controller 1220, and a host interface 1230. In some embodiments, the electronic system 1000 may include a plurality of integrated circuit devices 1100, and the controller 1200 may control the plurality of integrated circuit devices 1100.

The processor 1210 may control the operations of the electronic system 1000 including the controller 1200. The processor 1210 may operate according to preset firmware and control the NAND controller 1220 and/or access the integrated circuit device 1100. The NAND controller 1220 may include a NAND interface 1221 configured to process communication with the integrated circuit device 1100 (and/or the plurality of integrated circuit devices 1100). Through the NAND interface 1221, a control command may be transmitted for controlling the integrated circuit device 1100, data to be written in the plurality of memory cell transistors MCT of the integrated circuit device 1100, data to be read from the plurality of memory cell transistors MCT, or the like. The host interface 1230 may provide a communication function between the electronic system 1000 and an external host. For example, when a control command is received from the external host through the host interface 1230, the processor 1210 may control the integrated circuit device 1100 in response to the control command.

Figure 16:
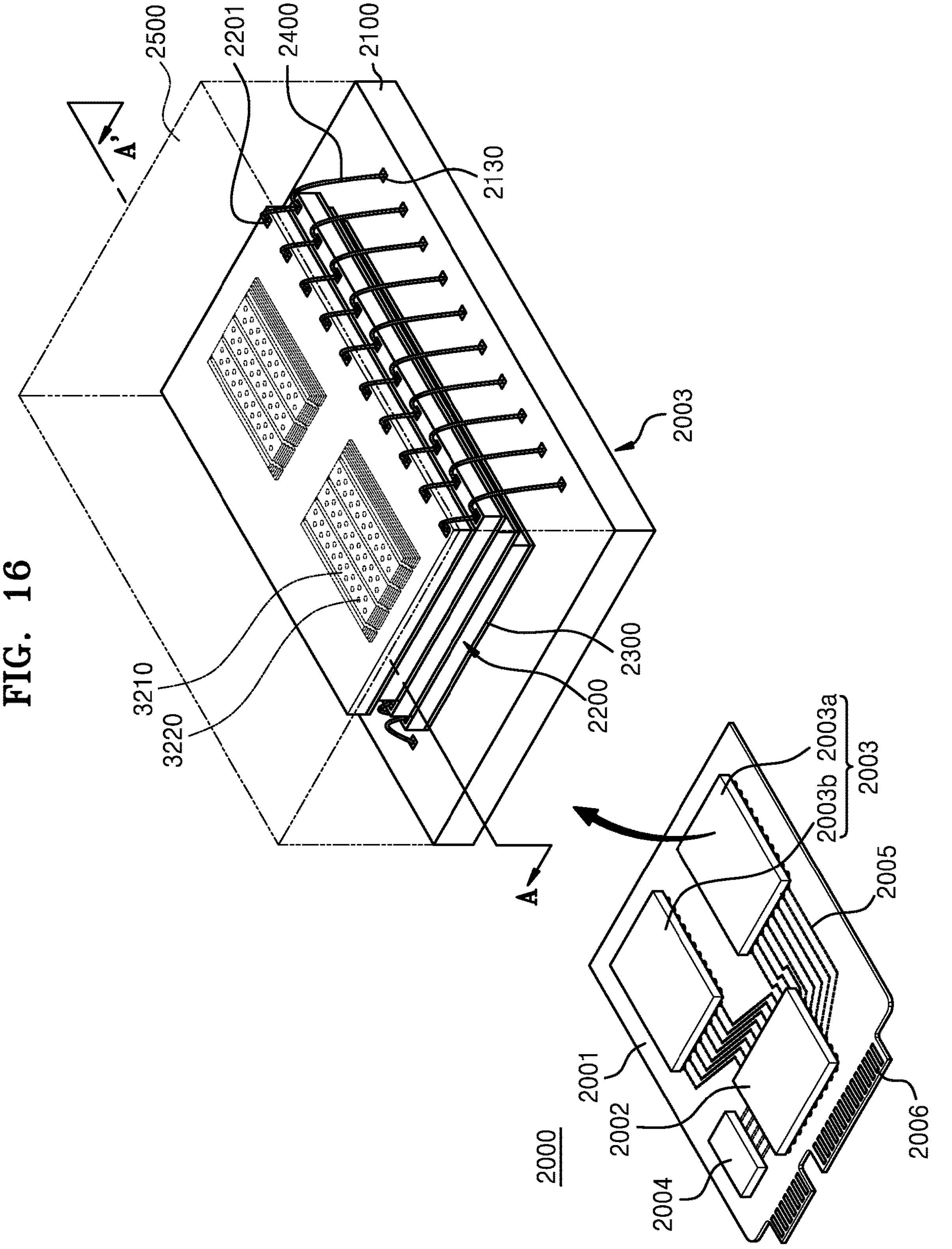
FIG. 16 is a perspective view illustrating an electronic system including an integrated circuit device, according to an embodiment.

FIG. 16 is a perspective view illustrating an electronic system 2000 including an integrated circuit device, according to an embodiment.

Referring to FIG. 16, the electronic system 2000, according to an embodiment of the present disclosure, may include a main substrate 2001, a controller 2002, one or more semiconductor packages 2003, and dynamic random-access memory (DRAM) 2004. The controller 2002 may be mounted on the main substrate 2001.

The main substrate 2001 may include a connector 2006 that may include a plurality of pins to be coupled to the external host. The number and arrangement of the plurality of pins of the connector 2006 may vary depending on a communication interface between the electronic system 2000 and the external host. In some embodiments, the electronic system 2000 may communicate with the external host according to any one of interfaces, including, but not limited to, USB, peripheral component interconnect express (PCI-Express), serial advanced technology attachment (SATA), M-Phy for a universal flash storage (UFS), and the like. In some embodiments, the electronic system 2000 may operate by power received from the external host through the connector 2006. The electronic system 2000 may further include a power management integrated circuit (PMIC) configured to distribute the power received from the external host to the controller 2002 and the semiconductor package 2003. The semiconductor package 2003 and the DRAM 2004 may be connected to the controller 2002 by a plurality of line patterns 2005 formed in the main substrate 2001.

The controller 2002 may write data in the semiconductor package 2003 and/or read data from the semiconductor package 2003. The controller 2002 may improve an operating speed of the electronic system 2000.

The DRAM 2004 may be a buffer memory for reducing a speed difference between the semiconductor package 2003, which is a data storage space, and the external host. The DRAM 2004 included in the electronic system 2000 may also operate as a kind of cache memory and provide a space for temporarily storing data in a control operation for the semiconductor package 2003. When the DRAM 2004 is included in the electronic system 2000, the controller 2002 may further include a DRAM controller (not shown) for controlling the DRAM 2004 in addition to the NAND controller (not shown) for controlling the semiconductor package 2003.

The semiconductor package 2003 may include a first semiconductor package 2003*a* and a second semiconductor package 2003*b*. In some embodiments, the first semiconductor package 2003*a* and the second semiconductor package 2003*b* may be apart from each other. Each of the first semiconductor package 2003*a* and second the semiconductor package 2003*b* may be a semiconductor package including a plurality of semiconductor chips 2200. That is, each of the first semiconductor package 2003*a* and the second semiconductor package 2003*b* may include a package substrate 2100, the plurality of semiconductor chips 2200, an adhesive layer 2300, a connection structure 2400, and a molding layer 2500. The plurality of semiconductor chips 2200 may be on the package substrate 2100. The adhesive layer 2300 may be disposed on a lower surface of each of the plurality of semiconductor chips 2200. The connection structure 2400 may electrically connect the plurality of semiconductor chips 2200 to the package substrate 2100. The molding layer 2500 may cover the plurality of semiconductor chips 2200 and the connection structure 2400 on the package substrate 2100.

The package substrate 2100 may be a printed circuit board including a plurality of package upper pads 2130. Each of the plurality of semiconductor chips 2200 may include an I/O pad 2201. The I/O pad 2201 may correspond to the I/O pad 1101 in FIG. 15. Each of the plurality of semiconductor chips 2200 may include a plurality of gate stacks 3210 and a plurality of channel structures 3220. The plurality of semiconductor chips 2200 may include and/or may be similar in many respects to at least one of the integrated circuit devices 100, 200, 300, and 400 described above with reference to FIGS. 4 to 12, and/or may include additional features not mentioned above.

In some embodiments, the connection structure 2400 may be a bonding wire that electrically connects the I/O pad 2201 to the package upper pad 2130. Accordingly, in the first semiconductor package 2003*a* and the second semiconductor package 2003*b*, the plurality of semiconductor chips 2200 may be electrically connected to each other by a bonding wire method, and may be electrically connected to the package upper pad 2130 of the package substrate 2100. In some embodiments, in the first semiconductor package 2003*a* and the second semiconductor package 2003*b*, the plurality of semiconductor chips 2200 may be electrically connected to each other by a connection structure, including, but not limited to, a through silicon via (TSV), instead of the connection structure 2400 using the bonding wire method.

In some embodiments, the controller 2002 and the plurality of semiconductor chips 2200 may be included in a single package. In some embodiments, the controller 2002 and the plurality of semiconductor chips 2200 may be mounted on an additional interposer substrate that is different from the main substrate 2001, and connected to each other by a line formed on the interposer substrate.

Figure 17:
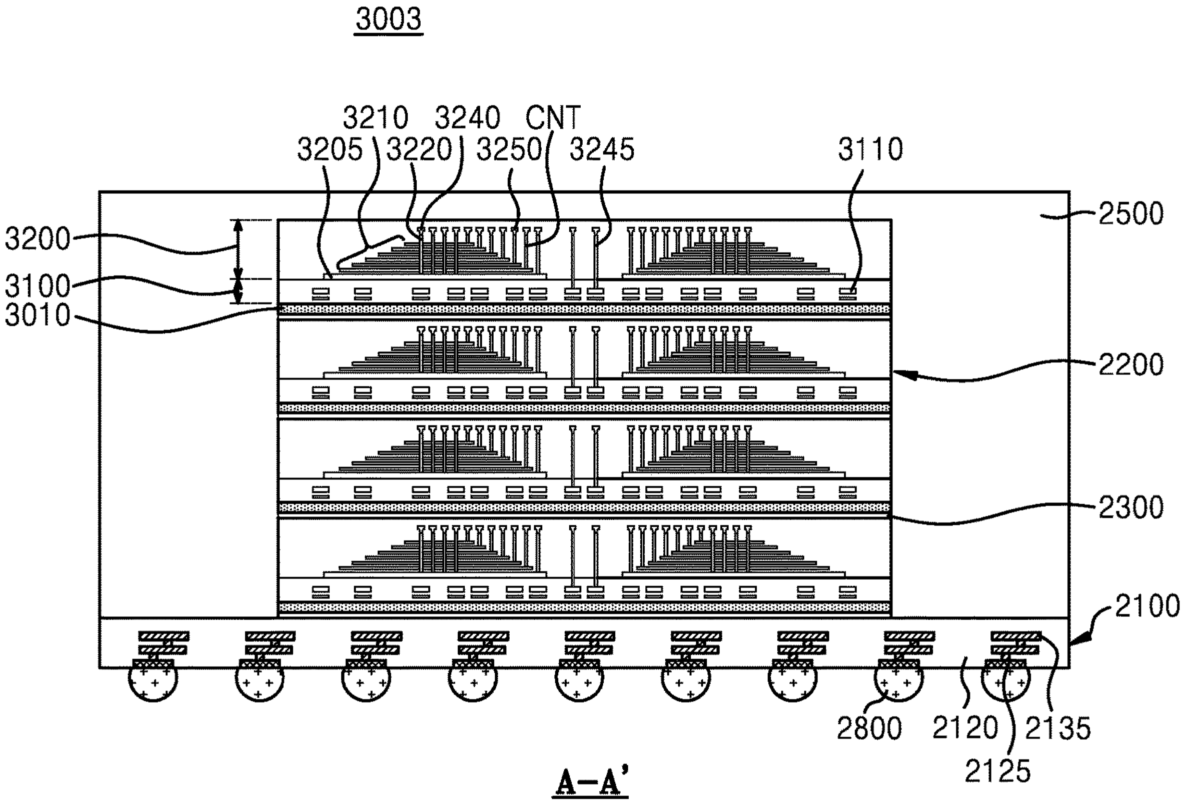
FIGS. 17 and 18 are cross-sectional views illustrating a semiconductor package including an integrated circuit device, according to an embodiment.
Figure 18:
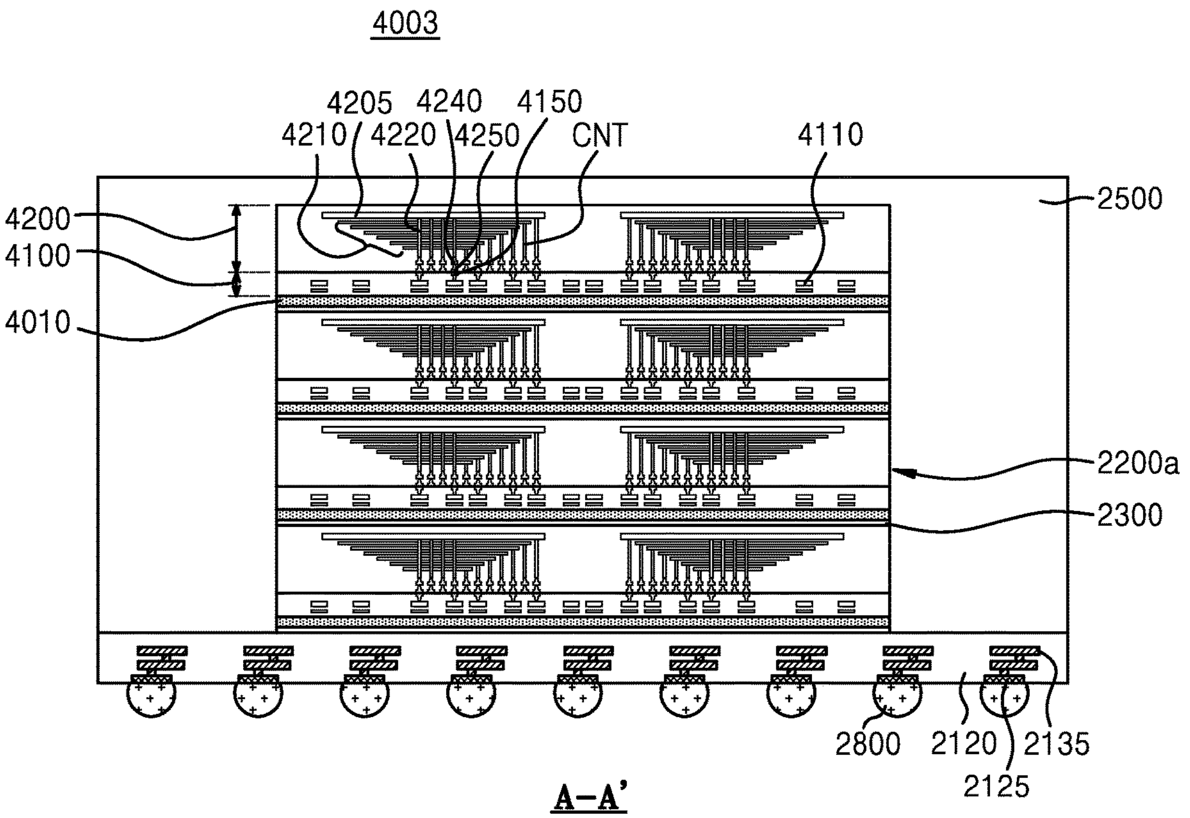

FIGS. 17 and 18 are cross-sectional views illustrating a semiconductor package including an integrated circuit device, according to an embodiment.

For example, FIGS. 17 and 18 show a detailed configuration of a cross-section of the semiconductor package, taken along line A-A' in FIG. 16.

Referring to FIG. 17, in the semiconductor package 3003, the package substrate 2100 may be a printed circuit board. The package substrate 2100 may include a body portion 2120, the plurality of package upper pads 2130 (see FIG. 16), a plurality of lower pads 2125, and a plurality of internal lines 2135. The plurality of package upper pads 2130 may be disposed on an upper surface of the body portion 2120. The plurality of lower pads 2125 may be disposed on a lower surface of the body portion 2120 or exposed through the lower surface. The plurality of internal lines 2135 may electrically connect the plurality of upper pads 2130 to the plurality of lower pads 2125 in the body portion 2120. The plurality of upper pads 2130 may be electrically connected to the plurality of connection structures 2400 (see FIG. 16). The plurality of lower pads 2125 may be connected to the plurality of line patterns 2005 on the main substrate 2001 of the electronic system 2000 shown in FIG. 16, through a plurality of conductive connection portions 2800.

Each of the plurality of semiconductor chips 2200 may include a semiconductor substrate 3010, a first structure 3100, and a second structure 3200. The first structure 3100 and the second structure 3200 may be sequentially stacked on the semiconductor substrate 3010. The first structure 3100 may include a peripheral circuit area including a plurality of peripheral lines 3110. The second structure 3200 may include a common source line 3205, a gate stack 3210, a channel structure 3220, and a bit line 3240. The gate stack 3210 may be disposed on the common source line 3205. The channel structure 3220 may pass through the gate stack 3210. The bit line 3240 may be electrically connected to the channel structure 3220.

Each of the plurality of semiconductor chips 2200 may include a through line 3245 that is electrically connected to the plurality of peripheral lines 3110 of the first structure 3100 and extends into the second structure 3200. The through line 3245 may be arranged outside the gate stack 3210. In some embodiments, the semiconductor package 3003 may further include a through line passing through the gate stack 3210. Each of the plurality of semiconductor chips 2200 may further include the I/O pad 2201 (see FIG. 16) that is electrically connected to the plurality of peripheral lines 3110 of the first structure 3100.

Referring to FIG. 18, a semiconductor package 4003 may have a similar configuration to a configuration of the semiconductor package 3003 described above with reference to FIG. 17. However, the semiconductor package 4003 may include a plurality of semiconductor chips 2200*a*.

Each of the plurality of semiconductor chips 2200*a* may include a semiconductor substrate 4010, a first structure 4100, and a second structure 4200. The first structure 4100 may be disposed on the semiconductor substrate 4010. The second structure 4200 may be bonded to the first structure 4100 by a wafer bonding method on the first structure 4100. The first structure 4100 may include a peripheral circuit area including a peripheral line 4110 and a plurality of first bonding structures 4150. The second structure 4200 may include a common source line 4205, a gate stack 4210, and a channel structure 4220. The gate stack 4210 may be disposed between the common source line 4205 and the first structure 4100. The channel structure 4220 may pass through the gate stack 4210.

Alternatively or additionally, each of the plurality of semiconductor chips 2200*a* may include a plurality of second bonding structures 4250 electrically connected to the plurality of gate layers 130 of the gate stack 4210, respectively. For example, a portion of the plurality of second bonding structures 4250 may be configured to be connected to a bit line 4240 that may be electrically connected to the channel structure 4220. Another portion of the plurality of second bonding structures 4250 may be configured to be electrically connected to the gate layer 130 through the plurality of contact plugs CNT.

The plurality of first bonding structures 4150 of the first structure 4100 and the plurality of second bonding structures 4250 of the second structure 4200 may be bonded to each other in contact with each other. For example, bonded portions of the plurality of first bonding structures 4150 and the plurality of second bonding structures 4250 may include, but not be limited to, copper (Cu). However, the present disclosure is not limited thereto.

While the present disclosure has been particularly shown and described with reference to embodiments thereof, it will be understood that various changes in form and details may be made therein without departing from the spirit and scope of the following claims.

What is claimed is:

1. An integrated circuit device, comprising:
- a semiconductor substrate comprising a memory cell area and a connection area;
- a gate stack comprising a plurality of word lines and a plurality of insulating layers, the plurality of word lines and the plurality of insulating layers extending in a first direction of a main surface of the semiconductor substrate and being alternately stacked in a second direction perpendicular to the main surface of the semiconductor substrate;
- a word line cut region passing through the plurality of word lines in the memory cell area and the connection area and extending in a third direction;
- a plurality of first channel structures disposed on the memory cell area and each of the plurality of first channel structures extending in the second direction and passing through the gate stack in the second direction;
- at least one string select line disposed on the gate stack in the memory cell area;
- a plurality of second channel structures passing through the at least one string select line and each of the plurality of second channel structures extending in the second direction; and
- a string select line cut region passing through the at least one string select line and extending in the third direction,
- wherein a portion of the at least one string select line is disposed as a cover structure overlapping the word line cut region,
- wherein the word line cut region has a shape of which a first horizontal width decreases as a distance from the main surface of the semiconductor substrate decreases, and
- wherein the cover structure disposed on the word line cut region extends in the third direction and has a shape of which a second horizontal width increases as the distance from the main surface of the semiconductor substrate decreases.

2. The integrated circuit device of claim 1, wherein the string select line cut region has a shape of which a third horizontal width decreases as the distance from the main surface of the semiconductor substrate decreases, and
- wherein the string select line cut region is disposed on both sidewalls of the cover structure.

3. The integrated circuit device of claim 1, wherein the first horizontal width of an uppermost end of the word line cut region is less than the second horizontal width of a lowermost end of the cover structure.

4. The integrated circuit device of claim 1, wherein a seam surrounded by an insulating material is disposed on the word line cut region, the seam being an empty space, and
- wherein the seam and the cover structure overlap each other in the second direction.

5. The integrated circuit device of claim 1, wherein a first level of an uppermost end of the word line cut region is substantially equal to a second level of an uppermost end of the plurality of first channel structures.

6. The integrated circuit device of claim 5, wherein the cover structure comprises a conductive material, and
- wherein an insulating layer is disposed between the word line cut region and the cover structure.

7. The integrated circuit device of claim 6, wherein the plurality of first channel structures are electrically coupled to the plurality of second channel structures disposed on the plurality of first channel structures through a connection via passing through the insulating layer.

8. The integrated circuit device of claim 7, wherein in a plan view, a first central axis of each of the plurality of first channel structures is disposed in a staggered manner from a second central axis of a corresponding second channel structure of the plurality of second channel structures disposed on the plurality of first channel structures, and
- wherein the second central axis of a second channel structure adjacent to the word line cut region from among the plurality of second channel structures is biased toward the word line cut region.

9. The integrated circuit device of claim 1, wherein, in a plan view, in the connection area,
- the gate stack has a step structure in the connection area, and
- the cover structure exposes the step structure and covers the word line cut region.

10. An integrated circuit device, comprising:
- a word line stack comprising:
- a memory cell area;
- a connection area adjacent to the memory cell area; and
- a plurality of word lines stacked in a vertical direction,
- wherein each of the plurality of word lines is separated by a plurality of word line cut regions; and
- a string select line stack being disposed on the word line stack, and comprising at least one string select line stacked in the vertical direction, wherein each of the at least one string select line is separated by a plurality of string select line cut regions,
- wherein, in a plan view, in the connection area, a cover structure is disposed in a fork shape configured to cover the plurality of word line cut regions,
- wherein the cover structure comprises a same material as the at least one string select line,
- wherein each of the plurality of word line cut regions is an inverted trapezoidal shape, and
- wherein the cover structure on the plurality of word line cut regions is a trapezoidal shape.

11. The integrated circuit device of claim 10, wherein each of the plurality of word line cut regions extends, in the plan view, in a first horizontal direction,
- wherein each of the plurality of word line cut regions is apart from remaining cut regions of the plurality of word line cut regions in a second horizontal direction,
- wherein the second horizontal direction crosses the first horizontal direction, and
- wherein the plurality of word line cut regions are covered by the cover structure extending in the first horizontal direction in the connection area.

12. The integrated circuit device of claim 10, wherein the cover structure comprises a conductive material, and wherein each of the plurality of string select line cut regions comprises an insulating material.

13. The integrated circuit device of claim 12, wherein the cover structure comprises at least one of a single-layer structure of polysilicon, a first stacked structure of an oxide and polysilicon, and a second stacked structure of an oxide and a metal, and wherein each of the plurality of string select line cut regions comprises silicon oxide.

14. The integrated circuit device of claim 12, wherein a first height of the cover structure is substantially equal to a second height of each of the plurality of string select line cut regions.

15. The integrated circuit device of claim 10, further comprising:

a first channel structure disposed to pass through the word line stack; and a second channel structure disposed to pass through the string select line stack and disposed on the first channel structure, wherein a first central axis of the first channel structure and a second central axis of the second channel structure are disposed in a staggered manner.

16. The integrated circuit device of claim 15, wherein the second central axis of the second channel structure adjacent to the plurality of word line cut regions is biased toward the plurality of word line cut regions.

* * * * *